US010840916B2

(12) United States Patent
Ravi et al.

(10) Patent No.: US 10,840,916 B2
(45) Date of Patent: Nov. 17, 2020

(54) MULTIPLYING DELAY LOCK LOOP (MDLL) AND METHOD OF AVERAGING RING OSCILLATOR SIGNALS FOR JITTER COMPENSATION

(71) Applicant: Intel Corporation, Santa Clara, CA (US)

(72) Inventors: Ashoke Ravi, Portland, OR (US); Ofir Degani, Haifa (IL)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/629,170

(22) PCT Filed: Aug. 7, 2017

(86) PCT No.: PCT/US2017/045707
§ 371 (c)(1),
(2) Date: Jan. 7, 2020

(87) PCT Pub. No.: WO2019/032085
PCT Pub. Date: Feb. 14, 2019

(65) Prior Publication Data
US 2020/0228122 A1    Jul. 16, 2020

(51) Int. Cl.
*H03L 7/081*   (2006.01)
*H04L 25/03*   (2006.01)
(Continued)

(52) U.S. Cl.
CPC .......... *H03L 7/0812* (2013.01); *H03L 7/0995* (2013.01); *H04L 25/03133* (2013.01); *H03L 7/0805* (2013.01); *H03L 7/24* (2013.01)

(58) Field of Classification Search
CPC ....... H03L 7/0995; H03L 7/0805; H03L 7/24; H03L 7/08; H03L 7/0997; H03L 7/104; H03K 3/0315; H03K 5/14
(Continued)

(56) References Cited

U.S. PATENT DOCUMENTS 8,067,989 B1 * 11/2011 Groe .................... H03L 7/0995
                                                         327/156
10,250,264 B2 * 4/2019 Wang .................... H03L 7/0814
(Continued)

FOREIGN PATENT DOCUMENTS

KR         101643497 B1     7/2016

OTHER PUBLICATIONS

"International Application Serial No. PCT/US2017/045707, International Search Report dated Feb. 26, 2018", 3 pgs.
(Continued)

*Primary Examiner* — Leila Malek
(74) *Attorney, Agent, or Firm* — Schwegman Lundberg & Woessner, P.A.

(57) ABSTRACT

Aspects of present disclosure of multiplying delay lock loop (MDLL) circuitry and communication devices are generally described herein. The MDLL circuitry may comprise a multiplexer and a ring oscillator. The ring oscillator may comprise a cascade of delay elements. The multiplexer may receive a reference clock signal and may receive a ring oscillator output signal from a final delay element of the cascade of delay elements. The multiplexer may select, as a ring oscillator input signal, either the reference clock signal or the ring oscillator output signal. The ring oscillator may determine a jitter estimate based at least partly on a comparison between output signals of two particular delay elements of the cascade. The ring oscillator may compensate (Continued)

delay responses of the delay elements of the cascade based at least partly on the jitter estimate.

25 Claims, 9 Drawing Sheets

(51) Int. Cl.
*H03L 7/099* (2006.01)
*H03L 7/08* (2006.01)
*H03L 7/24* (2006.01)

(58) Field of Classification Search
USPC .......................................................... 375/219
See application file for complete search history.

(56) References Cited

U.S. PATENT DOCUMENTS

| | | |
|---|---|---|
| 2008/0252507 A1 | 10/2008 | Gerfers et al. |
| 2011/0109356 A1* | 5/2011 | Ali .......................... H03L 7/16 327/158 |
| 2015/0221285 A1 | 8/2015 | Song et al. |
| 2017/0155395 A1 | 6/2017 | Grollitsch et al. |

OTHER PUBLICATIONS

"International Application Serial No. PCT/US2017/045707, Written Opinion dated Feb. 26, 2018", 6 pgs.
"International Application Serial No. PCT/US2017/045707, International Preliminary Report on Patentability dated Feb. 20, 2020", 8 pgs.

\* cited by examiner

US 10,840,916 B2

MULTIPLYING DELAY LOCK LOOP (MDLL) AND METHOD OF AVERAGING RING OSCILLATOR SIGNALS FOR JITTER COMPENSATION

This application is a U.S. National Stage Filing under 35 U.S.C. 371 from International Application No. PCT/US2017/045707, filed Aug. 7, 2017 and published in English as WO 2019/032085 on Feb. 14, 2019, which is incorporated herein by reference in its entirety.

TECHNICAL FIELD

Aspects of present disclosure pertain to wireless communications. Some aspects of present disclosure relate to communication devices. Some aspects of present disclosure relate to mobile devices. Some aspects of present disclosure relate to stationary devices. Some aspects of present disclosure relate to ring oscillators. Some aspects of present disclosure relate to multiplying delay lock loops (MDLLs). Some aspects of present disclosure relate to phase noise compensation. Some aspects of present disclosure relate to jitter compensation.

BACKGROUND

In some cases, base stations and mobile devices may operate in a radio frequency (RF) range or other frequency range. Various challenges may arise for such operation, including phase noise, jitter and/or other impairments. In some cases, these and other impairments may negatively affect performance of the devices. Accordingly, there is a general need for methods and systems to enable communication in these and other scenarios.

DETAILED DESCRIPTION

The following description and the drawings sufficiently illustrate specific aspects of present disclosure to enable those skilled in the art to practice them. Other aspects of present disclosure may incorporate structural, logical, electrical, process, and other changes. Portions and features of some aspects of present disclosure may be included in, or substituted for, those of other aspects of present disclosure. Aspects of present disclosure set forth in the claims encompass all available equivalents of those claims.

Figure 1:
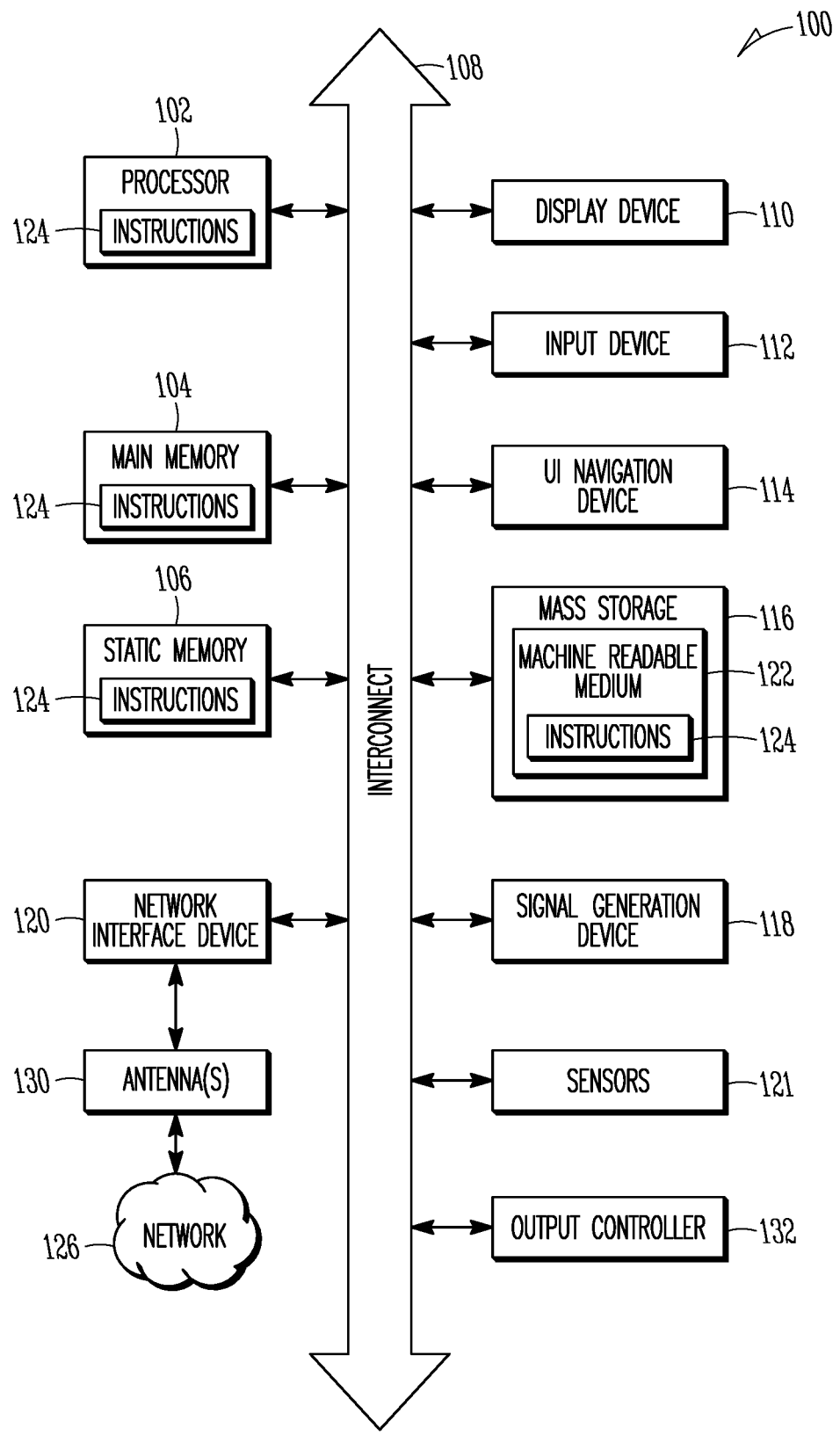
FIG. 1 illustrates an example machine in accordance with some aspects of present disclosure.

FIG. 1 illustrates a block diagram of an example machine in accordance with some aspects of present disclosure. The machine 100 is an example machine upon which any one or more of the techniques and/or methodologies discussed herein may be performed. In alternative aspects of present disclosure, the machine 100 may operate as a standalone device or may be connected (e.g., networked) to other machines. In a networked deployment, the machine 100 may operate in the capacity of a server machine, a client machine, or both in server-client network environments. In an example, the machine 100 may act as a peer machine in peer-to-peer (P2P) (or other distributed) network environment. The machine 100 may be an access point (AP), station (STA), User Equipment (UE), Evolved Node-B (eNB), mobile device, base station, personal computer (PC), a tablet PC, a set-top box (STB), a personal digital assistant (PDA), a mobile telephone, a smart phone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples as described herein, may include, or may operate on, logic or a number of components, modules, or mechanisms. Modules are tangible entities (e.g., hardware) capable of performing specified operations and may be configured or arranged in a certain manner. In an example, circuits may be arranged (e.g., internally or with respect to external entities such as other circuits) in a specified manner as a module. In an example, the whole or part of one or more computer systems (e.g., a standalone, client or server computer system) or one or more hardware processors may be configured by firmware or software (e.g., instructions, an application portion, or an application) as a module that operates to perform specified operations. In an example, the software may reside on a machine readable medium. In an example, the software, when executed by the underlying hardware of the module, causes the hardware to perform the specified operations.

Accordingly, the term "module" is understood to encompass a tangible entity, be that an entity that is physically constructed, specifically configured (e.g., hardwired), or temporarily (e.g., transitorily) configured (e.g., programmed) to operate in a specified manner or to perform part or all of any operation described herein. Considering examples in which modules are temporarily configured, each of the modules need not be instantiated at any one moment in time. For example, where the modules comprise a general-purpose hardware processor configured using software, the general-purpose hardware processor may be configured as respective different modules at different times. Software may accordingly configure a hardware processor, for example, to constitute a particular module at one instance of time and to constitute a different module at a different instance of time.

The machine (e.g., computer system) 100 may include a hardware processor 102 (e.g., a central processing unit (CPU), a graphics processing unit (GPU), a hardware processor core, or any combination thereof), a main memory 104 and a static memory 106, some or all of which may communicate with each other via an interlink (e.g., bus) 108. The machine 100 may further include a display unit 110, an alphanumeric input device 112 (e.g., a keyboard), and a user interface (UI) navigation device 114 (e.g., a mouse). In an example, the display unit 110, input device 112 and UI navigation device 114 may be a touch screen display. The machine 100 may additionally include a storage device (e.g., drive unit) 116, a signal generation device 118 (e.g., a speaker), a network interface device 120, and one or more sensors 121, such as a global positioning system (GPS) sensor, compass, accelerometer, or other sensor. The machine 100 may include an output controller 128, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device 116 may include a machine readable medium 122 on which is stored one or more sets of data structures or instructions 124 (e.g., software) embodying or utilized by any one or more of the techniques or functions described herein. The instructions 124 may also reside, completely or at least partially, within the main memory 104, within static memory 106, or within the hardware processor 102 during execution thereof by the machine 100. In an example, one or any combination of the hardware processor 102, the main memory 104, the static memory 106, or the storage device 116 may constitute machine readable media. In some aspects of present disclosure, the machine readable medium may be or may include a non-transitory computer-readable storage medium.

While the machine readable medium 122 is illustrated as a single medium, the term "machine readable medium" may include a single medium or multiple media (e.g., a centralized or distributed database, and/or associated caches and servers) configured to store the one or more instructions 124. The term "machine readable medium" may include any medium that is capable of storing, encoding, or carrying instructions for execution by the machine 100 and that cause the machine 100 to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks. In some examples, machine readable media may include non-transitory machine readable media. In some examples, machine readable media may include machine readable media that is not a transitory propagating signal.

The instructions 124 may further be transmitted or received over a communications network 126 using a transmission medium via the network interface device 120 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, a Long Term Evolution (LTE) family of standards, a Universal Mobile Telecommunications System (UMTS) family of standards, peer-to-peer (P2P) networks, among others. In an example, the network interface device 120 may include one or more physical jacks (e.g., Ethernet, coaxial, or phone jacks) or one or more antennas to connect to the communications network 126. In an example, the network interface device 120 may include a plurality of antennas to wirelessly communicate using at least one of single-input multiple-output (SIMO), multiple-input multiple-output (MIMO), or multiple-input single-output (MISO) techniques. In some examples, the network interface device 120 may wirelessly communicate using Multiple User MIMO techniques. The term "transmission medium" shall be taken to include any intangible medium that is capable of storing, encoding or carrying instructions for execution by the machine 100, and includes digital or analog communications signals or other intangible medium to facilitate communication of such software.

Aspects of present disclosure may be implemented in one or a combination of hardware, firmware and software. Aspects of present disclosure may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some aspects of present disclosure may include one or more processors and may be configured with instructions stored on a computer-readable storage device.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. In some aspects of present disclosure, the circuitry may be implemented in, or functions associated with the circuitry may be implemented by, one or more software or firmware modules. In some aspects of present disclosure, circuitry may include logic, at least partially operable in hardware. Aspects of present disclosure described herein may be implemented into a system using any suitably configured hardware and/or software.

Figure 2:
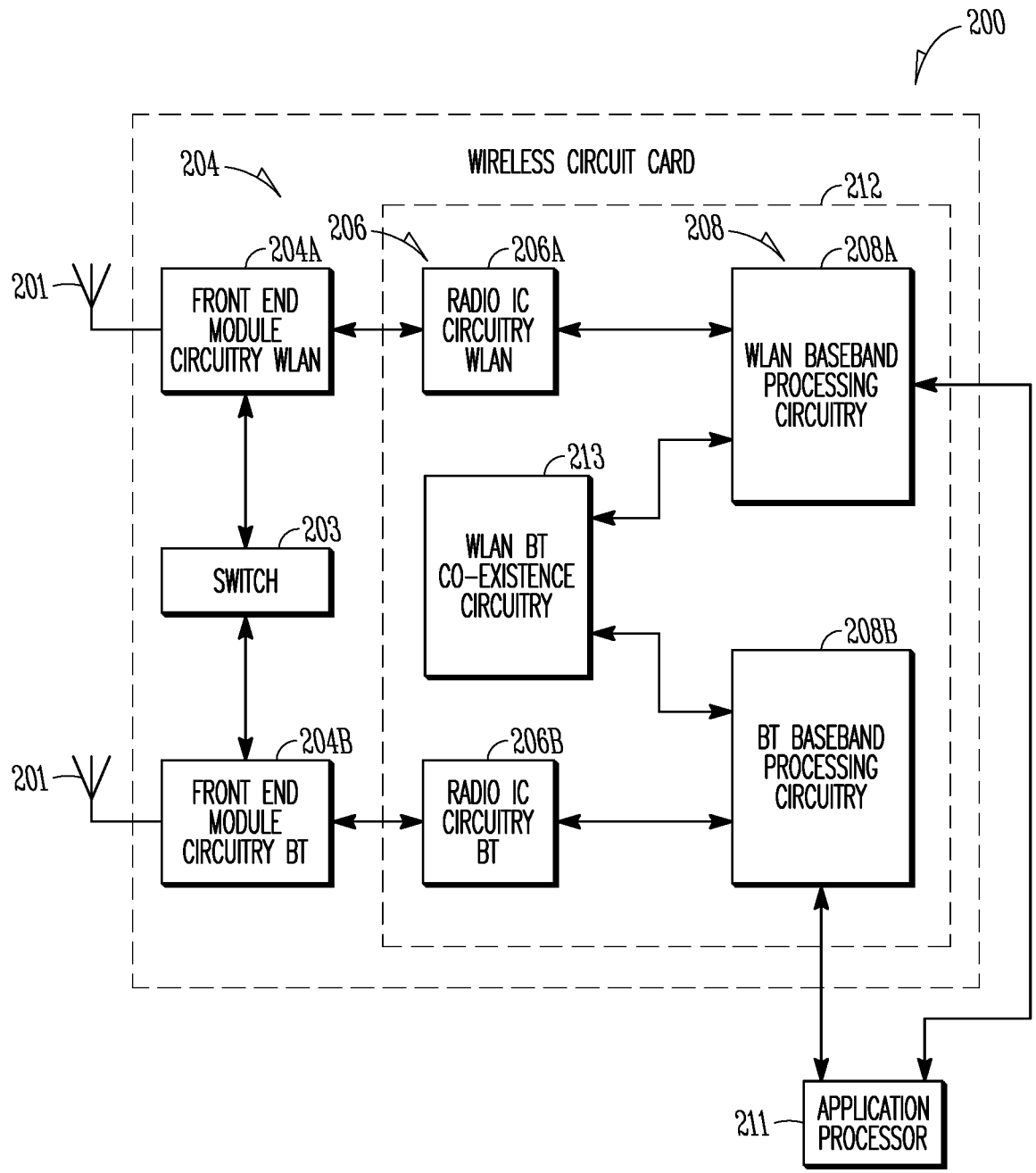
FIG. 2 is a block diagram of a radio architecture in accordance with some aspects of present disclosure.

FIG. 2 is a block diagram of a radio architecture 200 in accordance with some aspects of present disclosure. Radio architecture 200 may include radio front-end module (FEM) circuitry 204, radio IC circuitry 206 and baseband processing circuitry 208. Radio architecture 200 as shown includes both Wireless Local Area Network (WLAN) functionality and Bluetooth (BT) functionality although aspects of present disclosure are not so limited. In this disclosure, "WLAN" and "Wi-Fi" are used interchangeably.

Figure 3:
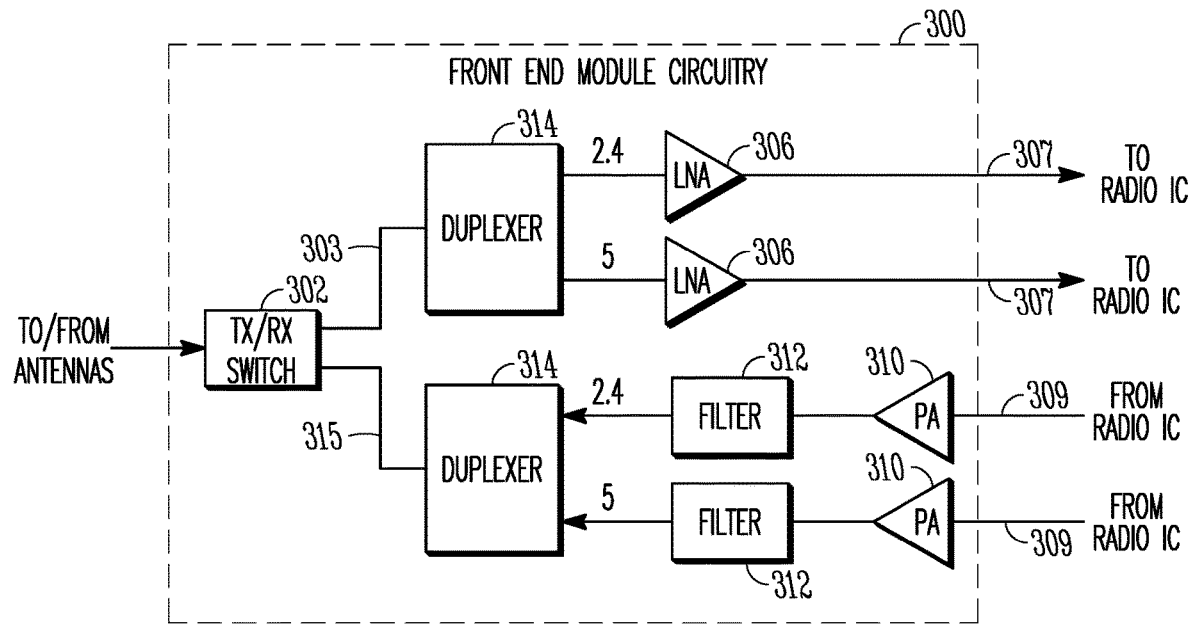
FIG. 3 illustrates a front-end module circuitry for use in the radio architecture of FIG. 2 in accordance with some aspects of present disclosure.
Figure 4:
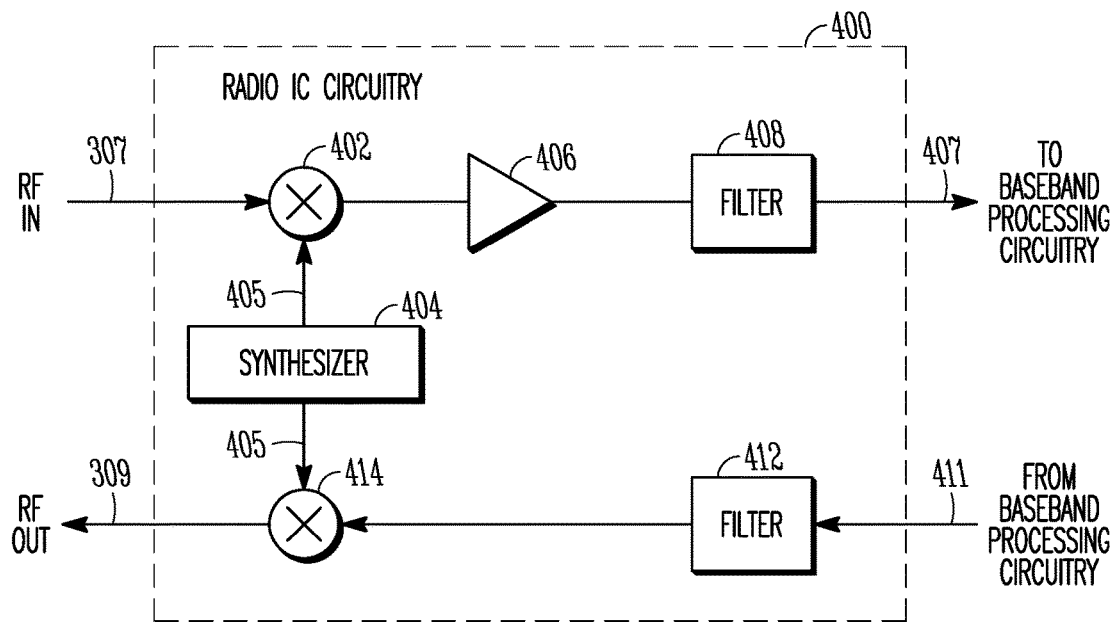
FIG. 4 illustrates a radio IC circuitry for use in the radio architecture of FIG. 2 in accordance with some aspects of present disclosure.
Figure 5:
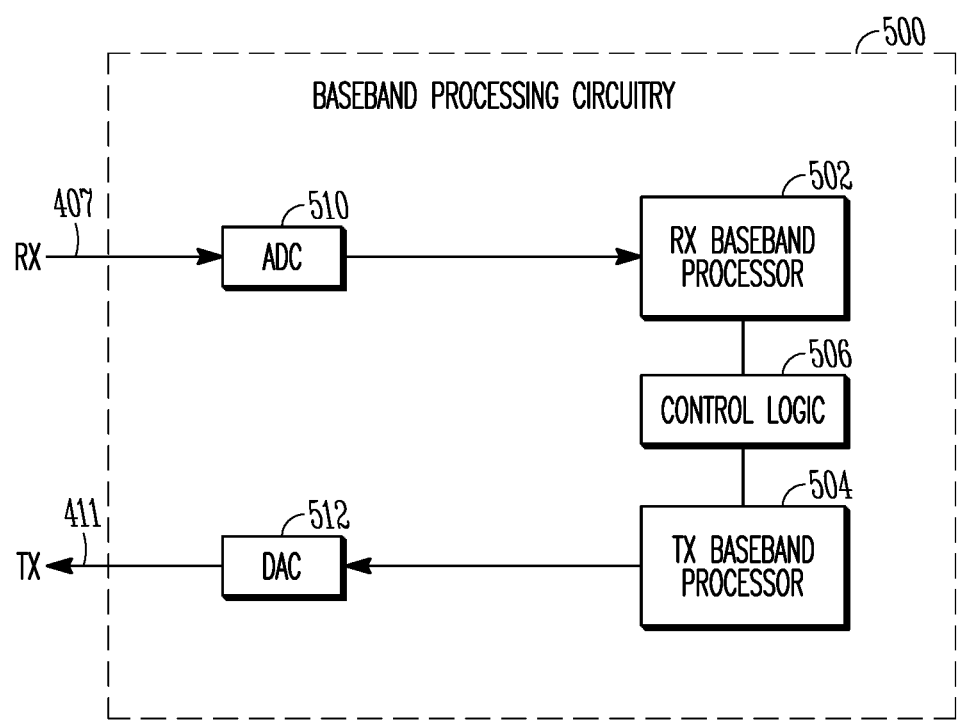
FIG. 5 illustrates a baseband processing circuitry for use in the radio architecture of FIG. 2 in accordance with some aspects of present disclosure.

It should be noted that the radio architecture 200 and components shown in FIGS. 3-5 may support WLAN and BT, but aspects of present disclosure are not limited to WLAN or BT. In some aspects of present disclosure, two technologies supported by the radio architecture 200 may or may not include WLAN or BT. Other technologies may be supported. In some aspects of present disclosure, WLAN and a second technology may be supported. In some aspects of present disclosure, BT and a second technology may be supported. In some aspects of present disclosure, two technologies other than WLAN and BT may be supported. In addition, the radio architecture 200 may be extended to support more than two protocols, technologies and/or standards, in some aspects of present disclosure. Aspects of present disclosure are also not limited to the frequencies illustrated in FIGS. 2-5.

FEM circuitry 204 may include a WLAN or Wi-Fi FEM circuitry 204a and a Bluetooth (BT) FEM circuitry 204b. The WLAN FEM circuitry 204a may include a receive signal path comprising circuitry configured to operate on WLAN RF signals received from one or more antennas 201, to amplify the received signals and to provide the amplified versions of the received signals to the WLAN radio IC circuitry 206a for further processing. The BT FEM circuitry 204b may include a receive signal path which may include circuitry configured to operate on BT RF signals received from one or more antennas 202, to amplify the received signals and to provide the amplified versions of the received signals to the BT radio IC circuitry 206b for further processing. FEM circuitry 204a may also include a transmit signal path which may include circuitry configured to amplify WLAN signals provided by the radio IC circuitry 206a for wireless transmission by one or more of the antennas 201. In addition, FEM circuitry 204b may also include a transmit signal path which may include circuitry configured to amplify BT signals provided by the radio IC circuitry 206b for wireless transmission by the one or more antennas. In the embodiment of FIG. 2, although FEM 204a and FEM 204b are shown as being distinct from one another, aspects of present disclosure are not so limited, and include within their scope the use of an FEM (not shown) that includes a transmit path and/or a receive path for both WLAN and BT signals, or the use of one or more FEM circuitries where at least some of the FEM circuitries share transmit and/or receive signal paths for both WLAN and BT signals.

Radio IC circuitry 206 as shown may include WLAN radio IC circuitry 206a and BT radio IC circuitry 206b. The WLAN radio IC circuitry 206a may include a receive signal path which may include circuitry to down-convert WLAN RF signals received from the FEM circuitry 204a and provide baseband signals to WLAN baseband processing circuitry 208a. BT radio IC circuitry 206b may in turn include a receive signal path which may include circuitry to down-convert BT RF signals received from the FEM circuitry 204b and provide baseband signals to BT baseband processing circuitry 208b. WLAN radio IC circuitry 206a may also include a transmit signal path which may include circuitry to up-convert WLAN baseband signals provided by the WLAN baseband processing circuitry 208a and provide WLAN RF output signals to the FEM circuitry 204a for subsequent wireless transmission by the one or more antennas 201. BT radio IC circuitry 206b may also include a transmit signal path which may include circuitry to up-convert BT baseband signals provided by the BT baseband processing circuitry 208b and provide BT RF output signals to the FEM circuitry 204b for subsequent wireless transmission by the one or more antennas 201. In the embodiment of FIG. 2, although radio IC circuitries 206a and 206b are shown as being distinct from one another, aspects of present disclosure are not so limited, and include within their scope the use of a radio IC circuitry (not shown) that includes a transmit signal path and/or a receive signal path for both WLAN and BT signals, or the use of one or more radio IC circuitries where at least some of the radio IC circuitries share transmit and/or receive signal paths for both WLAN and BT signals.

Baseband processing circuitry 208 may include a WLAN baseband processing circuitry 208a and a BT baseband processing circuitry 208b. The WLAN baseband processing circuitry 208a may include a memory, such as, for example, a set of RAM arrays in a Fast Fourier Transform or Inverse Fast Fourier Transform block (not shown) of the WLAN baseband processing circuitry 208a. Each of the WLAN baseband circuitry 208a and the BT baseband circuitry 208b may further include one or more processors and control logic to process the signals received from the corresponding WLAN or BT receive signal path of the radio IC circuitry 206, and to also generate corresponding WLAN or BT baseband signals for the transmit signal path of the radio IC circuitry 206. Each of the baseband processing circuitries 208a and 208b may further include physical layer (PHY) and medium access control layer (MAC) circuitry, and may further interface with application processor 210 for generation and processing of the baseband signals and for controlling operations of the radio IC circuitry 206.

Referring still to FIG. 2, according to the shown embodiment, WLAN-BT coexistence circuitry 213 may include logic providing an interface between the WLAN baseband circuitry 208a and the BT baseband circuitry 208b to enable use cases requiring WLAN and BT coexistence. In addition, a switch 203 may be provided between the WLAN FEM circuitry 204a and the BT FEM circuitry 204b to allow switching between the WLAN and BT radios according to application needs. In addition, although the antennas 201 are depicted as being respectively connected to the WLAN FEM circuitry 204a and the BT FEM circuitry 204b, aspects of present disclosure include within their scope the sharing of one or more antennas as between the WLAN and BT FEMs, or the provision of more than one antenna connected to each of FEM 204a or 204b.

In some aspects of present disclosure, the front-end module circuitry 204, the radio IC circuitry 206, and baseband processing circuitry 208 may be provided on a single radio card, such as wireless radio card 202. In some other aspects of present disclosure, the one or more antennas 201, the FEM circuitry 204 and the radio IC circuitry 206 may be provided on a single radio card. In some other aspects of present disclosure, the radio IC circuitry 206 and the baseband processing circuitry 208 may be provided on a single chip or integrated circuit (IC), such as IC 212.

In some aspects of present disclosure, the wireless radio card 202 may include a WLAN radio card and may be configured for Wi-Fi communications, although the scope of the aspects of present disclosure is not limited in this respect. In some of these aspects of present disclosure, the radio architecture 200 may be configured to receive and transmit orthogonal frequency division multiplexed (OFDM) or orthogonal frequency division multiple access (OFDMA)

communication signals over a multicarrier communication channel. The OFDM or OFDMA signals may comprise a plurality of orthogonal subcarriers.

In some of these multicarrier aspects of present disclosure, radio architecture 200 may be part of a Wi-Fi communication station (STA) such as a wireless access point (AP), a base station or a mobile device including a Wi-Fi device. In some of these aspects of present disclosure, radio architecture 200 may be configured to transmit and receive signals in accordance with specific communication standards and/or protocols, such as any of the Institute of Electrical and Electronics Engineers (IEEE) standards including, 802.11n-2009, IEEE 802.11-2012, 802.11n-2009, 802.11ac, and/or 802.11ax standards and/or proposed specifications for WLANs, although the scope of aspects of present disclosure is not limited in this respect. Radio architecture 200 may also be suitable to transmit and/or receive communications in accordance with other techniques and standards.

In some aspects of present disclosure, the radio architecture 200 may be configured for high-efficiency (HE) Wi-Fi (HEW) communications in accordance with the IEEE 802.11ax standard. In these aspects of present disclosure, the radio architecture 200 may be configured to communicate in accordance with an OFDMA technique, although the scope of the aspects of present disclosure is not limited in this respect.

In some other aspects of present disclosure, the radio architecture 200 may be configured to transmit and receive signals transmitted using one or more other modulation techniques such as spread spectrum modulation (e.g., direct sequence code division multiple access (DS-CDMA) and/or frequency hopping code division multiple access (FH-CDMA)), time-division multiplexing (TDM) modulation, and/or frequency-division multiplexing (FDM) modulation, although the scope of the aspects of present disclosure is not limited in this respect.

In some aspects of present disclosure, as further shown in FIG. 2, the BT baseband circuitry 208*b* may be compliant with a Bluetooth (BT) connectivity standard such as Bluetooth, Bluetooth 4.0 or Bluetooth 5.0, or any other iteration of the Bluetooth Standard. In aspects of present disclosure that include BT functionality as shown for example in FIG. 2, the radio architecture 200 may be configured to establish a BT synchronous connection oriented (SCO) link and or a BT low energy (BT LE) link. In some of the aspects of present disclosure that include functionality, the radio architecture 200 may be configured to establish an extended SCO (eSCO) link for BT communications, although the scope of the aspects of present disclosure is not limited in this respect. In some of these aspects of present disclosure that include a BT functionality, the radio architecture may be configured to engage in a BT Asynchronous Connection-Less (ACL) communications, although the scope of the aspects of present disclosure is not limited in this respect. In some aspects of present disclosure, as shown in FIG. 2, the functions of a BT radio card and WLAN radio card may be combined on a single wireless radio card, such as single wireless radio card 202, although aspects of present disclosure are not so limited, and include within their scope discrete WLAN and BT radio cards.

In some aspects of present disclosure, the radio-architecture 200 may include other radio cards, such as a cellular radio card configured for cellular (e.g., 3GPP such as LTE, LTE-Advanced or 5G communications).

In some IEEE 802.11 aspects of present disclosure, the radio architecture 200 may be configured for communication over various channel bandwidths including bandwidths having center frequencies of about 900 MHz, 2.4 GHz, 5 GHz. In some aspects of present disclosure, the bandwidths may be about 1 MHz, 2 MHz, 2.5 MHz, 4 MHz, 5 MHz, 8 MHz, 10 MHz, 16 MHz, 20 MHz, 40 MHz, 80 MHz (with contiguous bandwidths) or 80+80 MHz (160 MHz) (with non-contiguous bandwidths). In some aspects of present disclosure, a 320 MHz channel bandwidth may be used. In some aspects of present disclosure, the bandwidths may be about 2.16 GHz, 4.32 GHz, 6.48 GHz, 8.72 GHz and/or other suitable value. The scope of the aspects of present disclosure is not limited with respect to the above center frequencies or bandwidths, however.

FIG. 3 illustrates FEM circuitry 300 in accordance with some aspects of present disclosure. The FEM circuitry 300 is one example of circuitry that may be suitable for use as the WLAN and/or BT FEM circuitry 204*a*/204*b* (FIG. 2), although other circuitry configurations may also be suitable.

In some aspects of present disclosure, the FEM circuitry 300 may include a TX/RX switch 302 to switch between transmit mode and receive mode operation. The FEM circuitry 300 may include a receive signal path and a transmit signal path. The receive signal path of the FEM circuitry 300 may include a low-noise amplifier (LNA) 306 to amplify received RF signals 303 and provide the amplified received RF signals 307 as an output (e.g., to the radio IC circuitry 206 (FIG. 2)). The transmit signal path of the circuitry 300 may include a power amplifier (PA) to amplify input RF signals 309 (e.g., provided by the radio IC circuitry 206), and one or more filters 312, such as band-pass filters (BPFs), low-pass filters (LPFs) or other types of filters, to generate RF signals 315 for subsequent transmission (e.g., by one or more of the antennas 201 (FIG. 2)).

In some dual-mode aspects of present disclosure for Wi-Fi communication, the FEM circuitry 300 may be configured to operate in either the 2.4 GHz frequency spectrum or the 5 GHz frequency spectrum. In these aspects of present disclosure, the receive signal path of the FEM circuitry 300 may include a receive signal path duplexer 304 to separate the signals from each spectrum as well as provide a separate LNA 306 for each spectrum as shown. In these aspects of present disclosure, the transmit signal path of the FEM circuitry 300 may also include a power amplifier 310 and a filter 312, such as a BPF, a LPF or another type of filter for each frequency spectrum and a transmit signal path duplexer 314 to provide the signals of one of the different spectrums onto a single transmit path for subsequent transmission by the one or more of the antennas 201 (FIG. 2). In some aspects of present disclosure, BT communications may utilize the 2.4 GHZ signal paths and may utilize the same FEM circuitry 300 as the one used for WLAN communications.

FIG. 4 illustrates radio IC circuitry 400 in accordance with some aspects of present disclosure. The radio IC circuitry 400 is one example of circuitry that may be suitable for use as the WLAN or BT radio IC circuitry 206*a*/206*b* (FIG. 2), although other circuitry configurations may also be suitable.

In some aspects of present disclosure, the radio IC circuitry 400 may include a receive signal path and a transmit signal path. The receive signal path of the radio IC circuitry 400 may include at least mixer circuitry 402, such as, for example, down-conversion mixer circuitry, amplifier circuitry 406 and filter circuitry 408. The transmit signal path of the radio IC circuitry 400 may include at least filter circuitry 412 and mixer circuitry 414, such as, for example, up-conversion mixer circuitry. Radio IC circuitry 400 may also include synthesizer circuitry 404 for synthesizing a frequency 405 for use by the mixer circuitry 402 and the mixer circuitry 414. The mixer circuitry 402 and/or 414 may each, according to some aspects of present disclosure, be configured to provide direct conversion functionality. The latter type of circuitry presents a much simpler architecture as compared with standard super-heterodyne mixer circuitries, and any flicker noise brought about by the same may be alleviated for example through the use of OFDM modulation. FIG. 4 illustrates only a simplified version of a radio IC circuitry, and may include, although not shown, aspects of present disclosure where each of the depicted circuitries may include more than one component. For instance, mixer circuitry 420 and/or 414 may each include one or more mixers, and filter circuitries 408 and/or 412 may each include one or more filters, such as one or more BPFs and/or LPFs according to application needs. For example, when mixer circuitries are of the direct-conversion type, they may each include two or more mixers.

In some aspects of present disclosure, mixer circuitry 402 may be configured to down-convert RF signals 307 received from the FEM circuitry 204 (FIG. 2) based on the synthesized frequency 405 provided by synthesizer circuitry 404. The amplifier circuitry 406 may be configured to amplify the down-converted signals and the filter circuitry 408 may include a LPF configured to remove unwanted signals from the down-converted signals to generate output baseband signals 407. Output baseband signals 407 may be provided to the baseband processing circuitry 208 (FIG. 2) for further processing. In some aspects of present disclosure, the output baseband signals 407 may be zero-frequency baseband signals, although this is not a requirement. In some aspects of present disclosure, mixer circuitry 402 may comprise passive mixers, although the scope of the aspects of present disclosure is not limited in this respect.

In some aspects of present disclosure, the mixer circuitry 414 may be configured to up-convert input baseband signals 411 based on the synthesized frequency 405 provided by the synthesizer circuitry 404 to generate RF output signals 309 for the FEM circuitry 204. The baseband signals 411 may be provided by the baseband processing circuitry 208 and may be filtered by filter circuitry 412. The filter circuitry 412 may include a LPF or a BPF, although the scope of the aspects of present disclosure is not limited in this respect.

In some aspects of present disclosure, the mixer circuitry 402 and the mixer circuitry 414 may each include two or more mixers and may be arranged for quadrature down-conversion and/or up-conversion respectively with the help of synthesizer 404. In some aspects of present disclosure, the mixer circuitry 402 and the mixer circuitry 414 may each include two or more mixers each configured for image rejection (e.g., Hartley image rejection). In some aspects of present disclosure, the mixer circuitry 402 and the mixer circuitry 414 may be arranged for direct down-conversion and/or direct up-conversion, respectively. In some aspects of present disclosure, the mixer circuitry 402 and the mixer circuitry 414 may be configured for super-heterodyne operation, although this is not a requirement.

Mixer circuitry 402 may comprise, according to one embodiment: quadrature passive mixers (e.g., for the in-phase (I) and quadrature phase (Q) paths). In such an embodiment, RF input signal 307 from FIG. 4 may be down-converted to provide I and Q baseband output signals to be sent to the baseband processor.

Quadrature passive mixers may be driven by zero and ninety degree time-varying LO switching signals provided by a quadrature circuitry which may be configured to receive a LO frequency ($f_{LO}$) from a local oscillator or a synthesizer, such as LO frequency 405 of synthesizer 404 (FIG. 4). In some aspects of present disclosure, the LO frequency may be the carrier frequency, while in other aspects of present disclosure, the LO frequency may be a fraction of the carrier frequency (e.g., one-half the carrier frequency, one-third the carrier frequency). In some aspects of present disclosure, the zero and ninety degree time-varying switching signals may be generated by the synthesizer, although the scope of the aspects of present disclosure is not limited in this respect.

In some aspects of present disclosure, the LO signals may differ in duty cycle (the percentage of one period in which the LO signal is high) and/or offset (the difference between start points of the period). In some aspects of present disclosure, the LO signals may have a 25% duty cycle and a 50% offset. In some aspects of present disclosure, each branch of the mixer circuitry (e.g., the in-phase (I) and quadrature phase (Q) path) may operate at a 25% duty cycle, which may result in a significant reduction is power consumption.

The RF input signal 307 (FIG. 3) may comprise a balanced signal, although the scope of the aspects of present disclosure is not limited in this respect. The I and Q baseband output signals may be provided to low-nose amplifier, such as amplifier circuitry 406 (FIG. 4) or to filter circuitry 408 (FIG. 4).

In some aspects of present disclosure, the output baseband signals 407 and the input baseband signals 411 may be analog baseband signals, although the scope of the aspects of present disclosure is not limited in this respect. In some alternate aspects of present disclosure, the output baseband signals 407 and the input baseband signals 411 may be digital baseband signals. In these alternate aspects of present disclosure, the radio IC circuitry may include analog-to-digital converter (ADC) and digital-to-analog converter (DAC) circuitry.

In some dual-mode aspects of present disclosure, a separate radio IC circuitry may be provided for processing signals for each spectrum, or for other spectrums not mentioned here, although the scope of the aspects of present disclosure is not limited in this respect.

In some aspects of present disclosure, the synthesizer circuitry 404 may be a fractional-N synthesizer or a fractional N/N+1 synthesizer, although the scope of the aspects of present disclosure is not limited in this respect as other types of frequency synthesizers may be suitable. For example, synthesizer circuitry 404 may be a delta-sigma synthesizer, a frequency multiplier, or a synthesizer comprising a phase-locked loop with a frequency divider. According to some aspects of present disclosure, the synthesizer circuitry 404 may include digital synthesizer circuitry. An advantage of using a digital synthesizer circuitry is that, although it may still include some analog components, its footprint may be scaled down much more than the footprint of an analog synthesizer circuitry. In some aspects of present disclosure, frequency input into synthesizer circuitry 404 may be provided by a voltage controlled oscillator (VCO), although that is not a requirement. A divider control input may further be provided by either the baseband processing circuitry 208 (FIG. 2) or the application processor 210 (FIG. 2) depending on the desired output frequency 405. In some aspects of present disclosure, a divider control input (e.g., N) may be determined from a look-up table (e.g., within a Wi-Fi card) based on a channel number and a channel center frequency as determined or indicated by the application processor 210.

In some aspects of present disclosure, synthesizer circuitry 404 may be configured to generate a carrier frequency as the output frequency 405, while in other aspects of present disclosure, the output frequency 405 may be a fraction of the carrier frequency (e.g., one-half the carrier frequency, one-third the carrier frequency). In some aspects of present disclosure, the output frequency 405 may be a LO frequency ($f_{LO}$).

FIG. 5 illustrates a functional block diagram of baseband processing circuitry 500 in accordance with some aspects of present disclosure. The baseband processing circuitry 500 is one example of circuitry that may be suitable for use as the baseband processing circuitry 208 (FIG. 2), although other circuitry configurations may also be suitable. The baseband processing circuitry 500 may include a receive baseband processor (RX BBP) 502 for processing receive baseband signals 409 provided by the radio IC circuitry 206 (FIG. 2) and a transmit baseband processor (TX BBP) 504 for generating transmit baseband signals 411 for the radio IC circuitry 206. The baseband processing circuitry 500 may also include control logic 506 for coordinating the operations of the baseband processing circuitry 500.

In some aspects of present disclosure (e.g., when analog baseband signals are exchanged between the baseband processing circuitry 500 and the radio IC circuitry 206), the baseband processing circuitry 500 may include ADC 510 to convert analog baseband signals received from the radio IC circuitry 206 to digital baseband signals for processing by the RX BBP 502. In these aspects of present disclosure, the baseband processing circuitry 500 may also include DAC 512 to convert digital baseband signals from the TX BBP 504 to analog baseband signals.

In some aspects of present disclosure that communicate OFDM signals or OFDMA signals, such as through baseband processor 208a, the transmit baseband processor 504 may be configured to generate OFDM or OFDMA signals as appropriate for transmission by performing an inverse fast Fourier transform (IFFT). The receive baseband processor 502 may be configured to process received OFDM signals or OFDMA signals by performing an FFT. In some aspects of present disclosure, the receive baseband processor 502 may be configured to detect the presence of an OFDM signal or OFDMA signal by performing an autocorrelation, to detect a preamble, such as a short preamble, and by performing a cross-correlation, to detect a long preamble. The preambles may be part of a predetermined frame structure for Wi-Fi communication.

Referring back to FIG. 2, in some aspects of present disclosure, the antennas 201 (FIG. 2) may each comprise one or more directional or omnidirectional antennas, including, for example, dipole antennas, monopole antennas, patch antennas, loop antennas, microstrip antennas or other types of antennas suitable for transmission of RF signals. In some multiple-input multiple-output (MIMO) aspects of present disclosure, the antennas may be effectively separated to take advantage of spatial diversity and the different channel characteristics that may result. Antennas 201 may each include a set of phased-array antennas, although aspects of present disclosure are not so limited.

Although the radio-architecture 200 is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some aspects of present disclosure, the functional elements may refer to one or more processes operating on one or more processing elements.

Aspects of present disclosure may be implemented in one or a combination of hardware, firmware and software. Aspects of present disclosure may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. Some aspects of present disclosure may include one or more processors and may be configured with instructions stored on a computer-readable storage device.

In accordance with some aspects of present disclosure, multiplying delay lock loop (MDLL) circuitry may comprise a multiplexer and a ring oscillator. The ring oscillator may comprise a cascade of delay elements. The multiplexer may be configured to receive a reference clock signal. The multiplexer may be further configured to receive a ring oscillator output signal from a final delay element of the cascade of delay elements. The multiplexer may be further configured to select, for input to the ring oscillator input signal, either the reference clock signal or the ring oscillator output signal. The ring oscillator may be configured to receive, at a first delay element of the cascade, the ring oscillator input signal from the multiplexer. The ring oscillator may be further configured to determine a jitter estimate based at least partly on a comparison between output signals of two particular delay elements of the cascade. The ring oscillator may be further configured to compensate delay responses of the delay elements of the cascade based at least partly on the jitter estimate. The ring oscillator may be further configured to output the ring oscillator output signal as an output signal of the MDLL. These aspects of present disclosure are described in more detail below.

Figure 6:
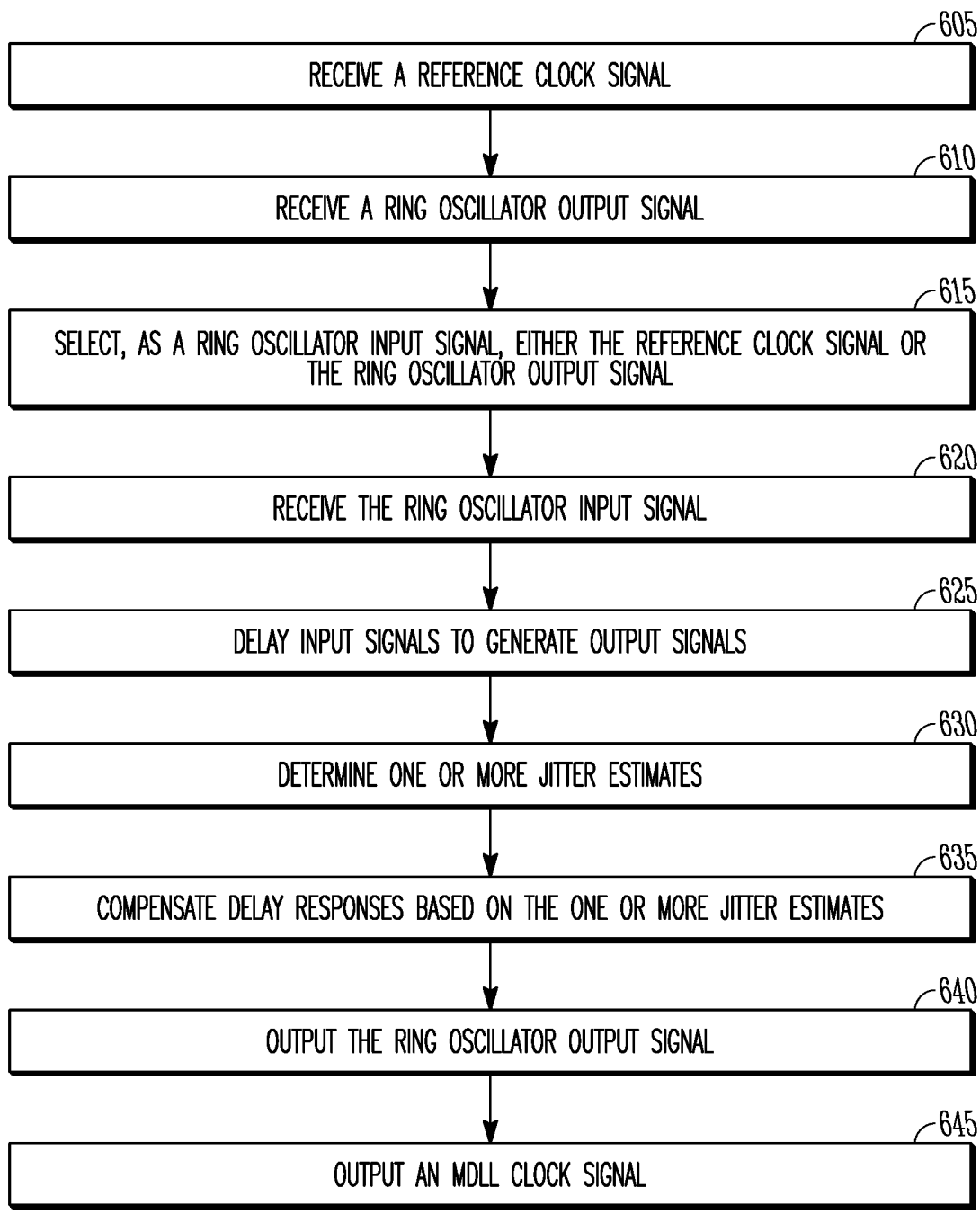
FIG. 6 illustrates the operation of a method of communication in accordance with some aspects of present disclosure.

FIG. 6 illustrates the operation of a method of communication in accordance with some aspects of present disclosure. It is important to note that aspects of present disclosure of the method 600 may include additional or even fewer operations or processes in comparison to what is illustrated in FIG. 6. In addition, aspects of present disclosure of the method 600 are not necessarily limited to the chronological order that is shown in FIG. 6. In describing the method 600, reference may be made to FIGS. 1-5 and 7-12, although it is understood that the method 600 may be practiced with any other suitable systems, interfaces and components.

In some aspects of present disclosure, a communication device (including but not limited to the devices described earlier and shown in any of FIGS. 1-5) may perform one or more operations of the method 600, but the scope of aspects of present disclosure is not limited in this respect. In some aspects of present disclosure, an apparatus of a communication device (including but not limited to the devices described earlier and shown in any of FIGS. 1-5) may perform one or more operations of the method 600, but the scope of aspects of present disclosure is not limited in this respect.

In some aspects of present disclosure, the operations may be performed by one or more components, including but not limited to components of a communication device and/or apparatus of a communication device. Example components/circuitry that may perform one or more operations include, but are not limited to, delay elements, ring oscillators, MDLL circuitry, jitter estimation circuitry, jitter compensation circuitry, stochastic time to digital converters (STDCs), averaging circuitry and/or other.

In some aspects of present disclosure, two or more different components may each perform one or more operations of the method 600. For instance, a first component may perform one or more operations and a second component may perform one or more operations. Aspects of present disclosure are not limited to two components. In a non-limiting example, a delay element may perform one or more operations of the method 600 and a multiplexer may perform one or more operations of the method 600. In this example, the delay element and the multiplexer may be part of a device and/or apparatus (such as a communication device and/or apparatus of a communication device). Aspects of present disclosure are not limited to communication devices, however, as any suitable type of device may be used in some aspects of present disclosure.

In some aspects of present disclosure, the method 600 and other methods described herein may be performed by an STA and/or AP arranged to operate in accordance with an 802.11 standard, protocol and/or specification and/or WLAN standard, protocol and/or specification. In some aspects of present disclosure, the method 600 and other methods described herein may be performed by an eNB and/or UE arranged to operate in accordance with a 3GPP LTE standard, protocol and/or specification and/or other 3GPP standard, protocol and/or specification. In some aspects of present disclosure, the method 600 and other methods described herein may be performed by other devices, which may or may not be arranged to operate in accordance with a standard. In some aspects of present disclosure, the method 600 and other methods described herein may be performed by an apparatus of a device, such as an STA, AP, UE, eNB and/or other device.

It should also be noted that aspects of present disclosure are not limited by references herein (such as in descriptions of the method 600 and/or other descriptions herein) to transmission, reception and/or exchanging of elements such as frames, messages, requests, indicators, signals or other elements. In some aspects of present disclosure, such an element may be generated, encoded or otherwise processed by processing circuitry (such as by a baseband processor included in the processing circuitry) for transmission. The transmission may be performed by a transceiver or other component, in some cases. In some aspects of present disclosure, such an element may be decoded, detected or otherwise processed by the processing circuitry (such as by the baseband processor). The element may be received by a transceiver or other component, in some cases. In some aspects of present disclosure, the processing circuitry and the transceiver may be included in a same apparatus. The scope of aspects of present disclosure is not limited in this respect, however, as the transceiver may be separate from the apparatus that comprises the processing circuitry, in some aspects of present disclosure.

In some aspects of present disclosure, an output from a first component may be input to a second component. In some cases, the first and second components may be connected directly, such as through a wired connection, in which case the output from the first component may be input directly to the second component. In some cases, the first and second components may not necessarily be connected directly. For instance, one or more other components may be included in a path between the first and second components. Accordingly, the output from the first component may be affected, in some cases, by one or more other components before being input to the second component. In such cases, the second component may receive the output from the first component indirectly. As an example, a filter may be included between the first and second components. It is understood that references to signals, inputs and/or outputs exchanged between components may include direct or indirect exchanges, in some aspects of present disclosure.

In some aspects of present disclosure, multiplying delay lock loop (MDLL) circuitry may comprise a multiplexer and a ring oscillator. The ring oscillator may comprise a cascade of delay elements. The cascade of delay elements may comprise a first delay element, a final delay element, and one or more other delay elements. In some aspects of present disclosure, the MDLL circuitry may comprise jitter compensation circuitry. In a non-limiting example, the jitter compensation circuitry may include one or more stochastic time to digital converters (STDCs). In some aspects of present disclosure, the cascade of delay elements and the jitter compensation circuitry may be part of the ring oscillator. In some aspects of present disclosure, the jitter compensation circuitry (such as the one or more STDCs) may be included as part of the ring oscillator. It should be noted that the components mentioned above (multiplexer, ring oscillator, cascade of delay elements, jitter compensation circuitry, STDCs) may not necessarily be included in the MDLL circuitry, in some aspects of present disclosure.

In some aspects of present disclosure, a communication device may comprise one or more of MDLL circuitry, jitter compensation circuitry, a ring oscillator, a cascade of delay elements, a multiplexer, a transceiver and one or more other components. In some aspects of present disclosure, the MDLL circuitry may include one or more of jitter compensation circuitry, a ring of oscillator, a cascade of delay elements, a multiplexer and one or more other components.

At operation 605, the multiplexer may receive a reference clock signal. In some aspects of present disclosure, the reference clock signal may be received from a clock, a reference clock, an oscillator, a reference oscillator and/or other component.

At operation 610, the multiplexer may receive a ring oscillator output signal. In some aspects of present disclosure, the multiplexer may receive the ring oscillator output signal from the cascade of delay elements. In some aspects of present disclosure, the multiplexer may receive (directly or indirectly) the ring oscillator output signal from a final delay element of the cascade of delay elements.

At operation 615, the multiplexer may select, as a ring oscillator input signal, either the reference clock signal or the ring oscillator output signal. In some aspects of present disclosure, the multiplexer may detect a rising edge of the reference clock signal. The multiplexer may select the reference clock signal for input to the ring oscillator input signal in response to the detection of the rising edge of the reference clock signal. Aspects of present disclosure are not limited to detection of the rising edge, however, as other techniques (such as usage of a pulsing signal that may or may not be based on the reference clock signal) may also be used. In some aspects of present disclosure, the multiplexer may select the ring oscillator input signal for input to the first delay element of the cascade, although the scope of aspects of present disclosure is not limited in this respect.

At operation 620, the ring oscillator signal may be received, from the multiplexer, at a first delay element of the cascade. In some aspects of present disclosure, the ring oscillator may receive the ring oscillator signal. In some aspects of present disclosure, an input signal for the cascade (such as a signal input to the first delay element) may be based at least partly on an output signal of the cascade. For instance, an output signal of the final delay element may be fed back to the first delay element. In some aspects of present disclosure, the feedback may be performed by the multiplexer. For instance, the multiplexer may receive the output signal and may either provide the output signal as feedback to the first delay element or provide the reference clock signal to the first delay element.

At operation 625, the delay elements of the cascade may generate output signals based on the input signals. In some aspects of present disclosure, the delay elements of the cascade may delay the input signals to generate the output signals. In some aspects of present disclosure, the output signals may be delayed versions of the input signals. In some aspects of present disclosure, the output signals may be based on delayed versions of the input signals. In some aspects of present disclosure, the output signals may be based on the input signals affected by one or more of: delay, distortion, amplification, attenuation, scaling, inversion and/or other effect. It should be noted that aspects of present disclosure are not limited to a cascade of delay elements. In a non-limiting example, a cascade of components may be used that includes a combination of one or more inverters and one or more delay elements. In another non-limiting example, a cascade of components may be used that includes one or more inverters, and may not necessarily include any delay elements. In another non-limiting example, a cascade of components may be used that includes any number (including zero, one or other) of each of the following: delay elements, inverters, and/or other component(s). It should also be noted that a clock frequency of an output signal of the cascade (such as an output of the final delay element, an MDLL output clock signal and/or other signal) may be inversely related to a sum of delays of the delay elements of the cascade, in some cases.

At operation 630, a jitter estimate may be determined. In some aspects of present disclosure, the jitter compensation circuitry may determine the jitter estimate, although the scope of aspects of present disclosure is not limited in this respect. In some aspects of present disclosure, the ring oscillator may determine the jitter estimate, although the scope of aspects of present disclosure is not limited in this respect. In some aspects of present disclosure, one or more STDCs may determine the jitter estimate, although the scope of aspects of present disclosure is not limited in this respect.

In some aspects of present disclosure, the jitter estimate may be determined based at least partly on a comparison between output signals of two particular delay elements of the cascade. In a non-limiting example, the jitter estimate may be determined based on a time difference between a rising edge of the output signal of one of the particular delay elements and a falling edge of the output signal of the other of the particular delay elements. In another non-limiting example, the jitter estimate may be determined based on a time difference between: a rising edge of the output signal of one particular delay element and a falling edge of the output signal of the other particular delay element, rising edges of the output signals of the particular delay elements, or falling edges of the output signals of the particular delay elements. In another non-limiting example, time differences between rising edges or falling edges of output signals of multiple pairs of delay elements may be determined. The jitter estimate may be based on an average of the time differences.

In another non-limiting example, a comparison between a rising edge of the output signal of one delay element and a falling edge of the output signal of another delay element may be performed as part of the determination of the jitter estimate.

In some aspects of present disclosure, the two particular delay elements used for the determination of the jitter estimate may be spaced apart within the cascade by half of a total number of delay elements of the cascade. Aspects of present disclosure are not limited to this particular configuration, however. One or more pairs of delay elements may be used, and any suitable spacing(s) (in terms of number of delay elements) may be used. In a non-limiting example, adjacent delay elements may be used in one or more of the pairs. In another non-limiting example, two pairs may have different spacings. For instance, two delay elements of a first pair may be spaced apart by a first spacing and two delay elements of a second pair may be spaced apart by a second spacing. This example may be extended to more than two spacings. In another non-limiting example, a uniform spacing may be used in the pairs.

In some aspects of present disclosure, the ring oscillator may comprise a stochastic time to digital converter (STDC) and averaging circuitry. The STDC may be part of jitter compensation circuitry, in some aspects of present disclosure, although the scope of aspects of present disclosure is not limited in this respect. The STDC may receive the output signals of two particular delay elements. The STDC may determine one or more time differences between a rising edge of the output signal of one of the particular delay elements and a falling edge of the output signal of the other particular delay element. Aspects of present disclosure are not limited to time differences between a rising edge and a falling edge, as time differences between two rising edges or two falling edges may also be used. The averaging circuitry may determine the jitter estimate based on an average of the time differences determined by the STDC.

In some aspects of present disclosure, the jitter compensation circuitry may comprise a stochastic time to digital converter (STDC) and averaging circuitry. The STDC may receive the output signals of two delay elements. In a non-limiting example, the STDC may determine one or more time differences between a rising edge of one of the received output signals and a falling edge of the other received output signals. In another non-limiting example, the STDC may determine one or more time differences between a rising edge of one of the received output signals and a rising edge of the other received output signals. In another non-limiting example, the STDC may determine one or more time differences between a falling edge of one of the received output signals and a falling edge of the other received output signals. Averaging circuitry may determine the jitter estimate based on an average of the time differences determined by the STDC.

At operation 635, delay responses of the delay elements may be compensated based on the one or more jitter estimates. In some aspects of present disclosure, delay responses of at least some of the delay elements may be adjusted, modified and/or otherwise changed to compensate for the jitter estimate. One or more of the ring oscillator, the jitter compensation circuitry, the MDLL circuitry and/or other component(s) may perform the compensation. Aspects of present disclosure are not limited to compensation of the delay responses of the delay elements, as any suitable compensation may be performed. For instance, compensation of the cascade of delay elements may be performed. In some aspects of present disclosure, compensation of signals (such as an output clock signal, an input signal to the cascade, a feedback signal and/or other signal) may be performed.

In a non-limiting example, the delay responses of the delay elements may be performed by modulation of input voltages of capacitors of the delay elements. The modulation may be based at least partly on the estimated jitter. In some aspects of present disclosure, other adjustments to the capacitors and/or signals connected to the capacitors may be performed to compensate the jitter. In some aspects of present disclosure, adjustments to other component(s) of the delay elements and/or signals connected to those component(s) may be performed to compensate the jitter.

At operation 640, the ring oscillator may output the ring oscillator output signal. In some aspects of present disclosure, the final delay element may output the ring oscillator output signal, although the scope of aspects of present disclosure is not limited in this respect. In a non-limiting example, the final delay element may receive the output signal from another delay element of the cascade that immediately precedes the final delay element. The final delay element may delay the final input signal to generate the ring oscillator output signal.

At operation 645, an MDLL clock signal may be generated. For instance, the MDLL clock signal may be and/or may be based on the ring oscillator output signal. The ring oscillator, the final delay element and/or the MDLL circuitry may generate the MDLL clock signal. It should be noted that the MDLL clock signal may be based on the ring oscillator output signal and may be processed by one or more other components, in some aspects of present disclosure. For instance, a low pass filter and/or other component may be used to convert the output clock signal to a sinusoidal signal.

In some aspects of present disclosure, the MDLL circuitry may further comprise a frequency lock loop (FLL). The FLL may be configured to output an FLL clock signal for input to the delay elements. In a non-limiting example, the FLL clock signal may be used as a drive signal for the delay elements. A clock frequency of the FLL clock signal may be based at least partly on a frequency multiple between a target clock frequency of the MDLL output signal and a clock frequency of the reference clock signal. For instance, the target clock frequency of the MDLL output signal may be a multiple of the clock frequency of the reference clock signal. In a non-limiting example, the multiple may be configurable to be an integer. In another non-limiting example, the multiple may be configurable to be a fraction and/or ratio of two integers. In another non-limiting example, the multiple may configurable to be an integer or a fraction.

In some aspects of present disclosure, the MDLL circuitry may be configurable as fractional-N MDLL circuitry if the frequency multiple is configurable for fractional numbers. In some aspects of present disclosure, the MDLL circuitry may be configurable as integer-N MDLL circuitry if the frequency multiple is restricted to integer numbers. In some aspects of present disclosure, the MDLL circuitry may be configurable as fractional-N MDLL circuitry or integer-N MDLL circuitry.

It should be noted that aspects of present disclosure are not limited to usage of FLLs as described above. Other suitable servers, control loops and/or components may be used, in some aspects of present disclosure.

In some aspects of present disclosure, the MDLL circuitry may further comprise a digital-to-time converter (DTC). The DTC may be configured to receive a DTC input that includes a target time difference. The DTC may generate the reference clock signal as a clock signal for which a time difference between successive rising edges is based on the target time difference. In a non-limiting example, the DTC input may include multiple bits that indicate the target time difference. For instance, a predetermined time step (in terms of microseconds, milliseconds or other interval) may be used, and the bits may indicate a number of those time steps between successive rising edges. Aspects of present disclosure are not limited to successive rising edges. Successive falling edges may be used in some aspects of present disclosure. In addition, other reference points, edges or other elements may be used.

In some aspects of present disclosure, a delay modulated reference clock (such as output from the DTC) may be used. The reference clock signal input to the multiplexer may be from a clock source (such as a crystal oscillator, PLL and/or other) in some aspects of present disclosure. A signal from such a clock source may be pre-modulated through a DTC in some aspects of present disclosure.

In some aspects of present disclosure, a communication device may comprise MDLL circuitry and a transceiver. The MDLL circuitry may comprise a cascade of delay elements, jitter compensation circuitry, and MDLL output circuitry. A final delay element of the cascade may delay a final input signal to generate a final output signal. The jitter compensation circuitry may compare the output signals of one or more pairs of the delay elements to determine a jitter estimate. The jitter compensation circuitry may adjust delay responses of at least some of the delay elements to compensate for the jitter estimate. The MDLL circuitry may generate an MDLL output clock signal based on the final output signal from the final delay element. The transceiver may multiply a baseband signal by the MDLL output clock signal to up-convert the baseband signal to a radio frequency (RF) range. The MDLL circuitry may further comprise a multiplexer. The multiplexer may receive a reference clock signal; may receive the final output signal from the final delay element; and may select, for input to the first delay element as the first input signal, either the final output signal or the reference clock signal. The jitter compensation circuitry may comprise an STDC and averaging circuitry. The STDC may receive the output signals of one of the pairs of delay elements. The STDC may determine one or more time differences between rising edges of one of the received output signals and falling edges of the other received output signal. The averaging circuitry may determine the jitter estimates based at least partly on an average of the time differences determined by the STDCs. The jitter compensation circuitry may adjust the delay responses by modulation of input voltages of capacitors of the delay elements. The modulation may be based at least partly on the estimated jitter.

Figure 7:
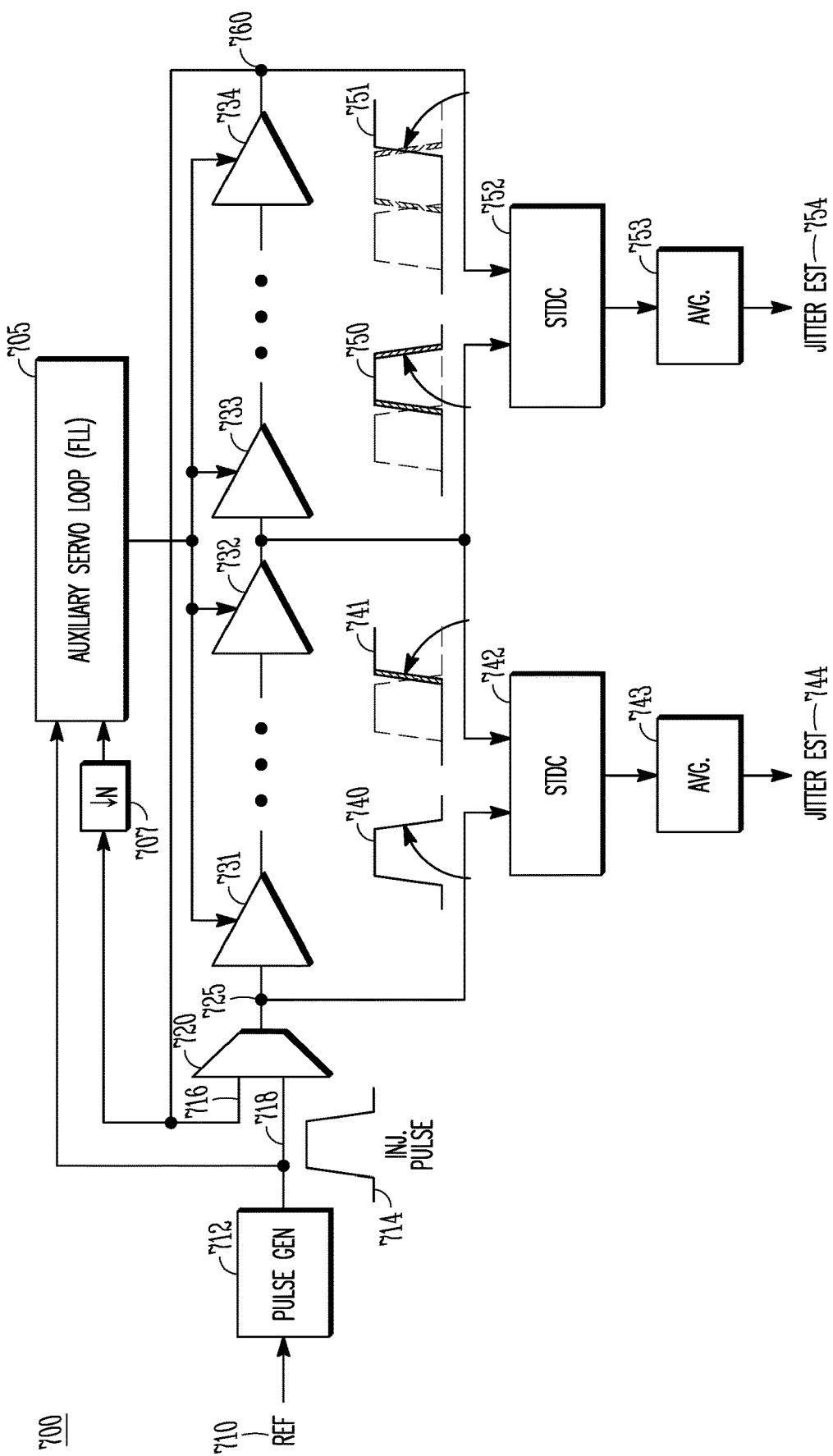
FIG. 7 illustrates example multiplying delay lock loop (MDLL) circuitry in accordance with some aspects of present disclosure.
Figure 8:
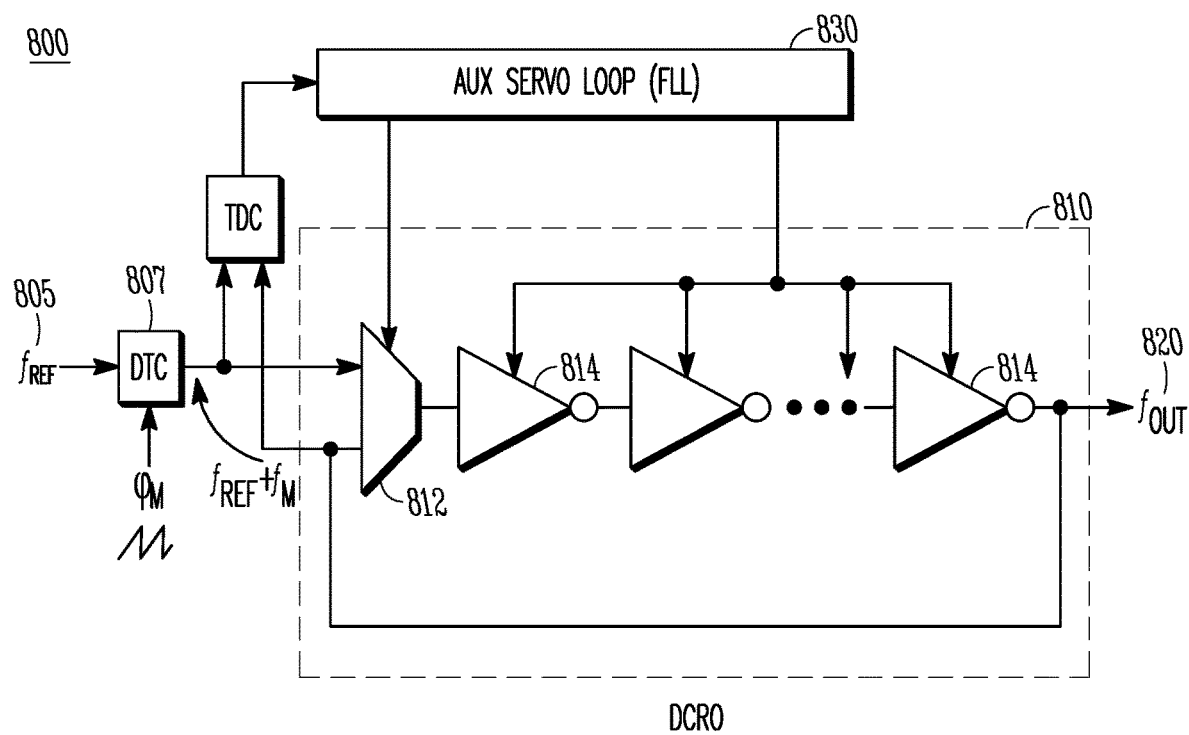
FIG. 8 illustrates example MDLL circuitry in accordance with some aspects of present disclosure.
Figure 9:
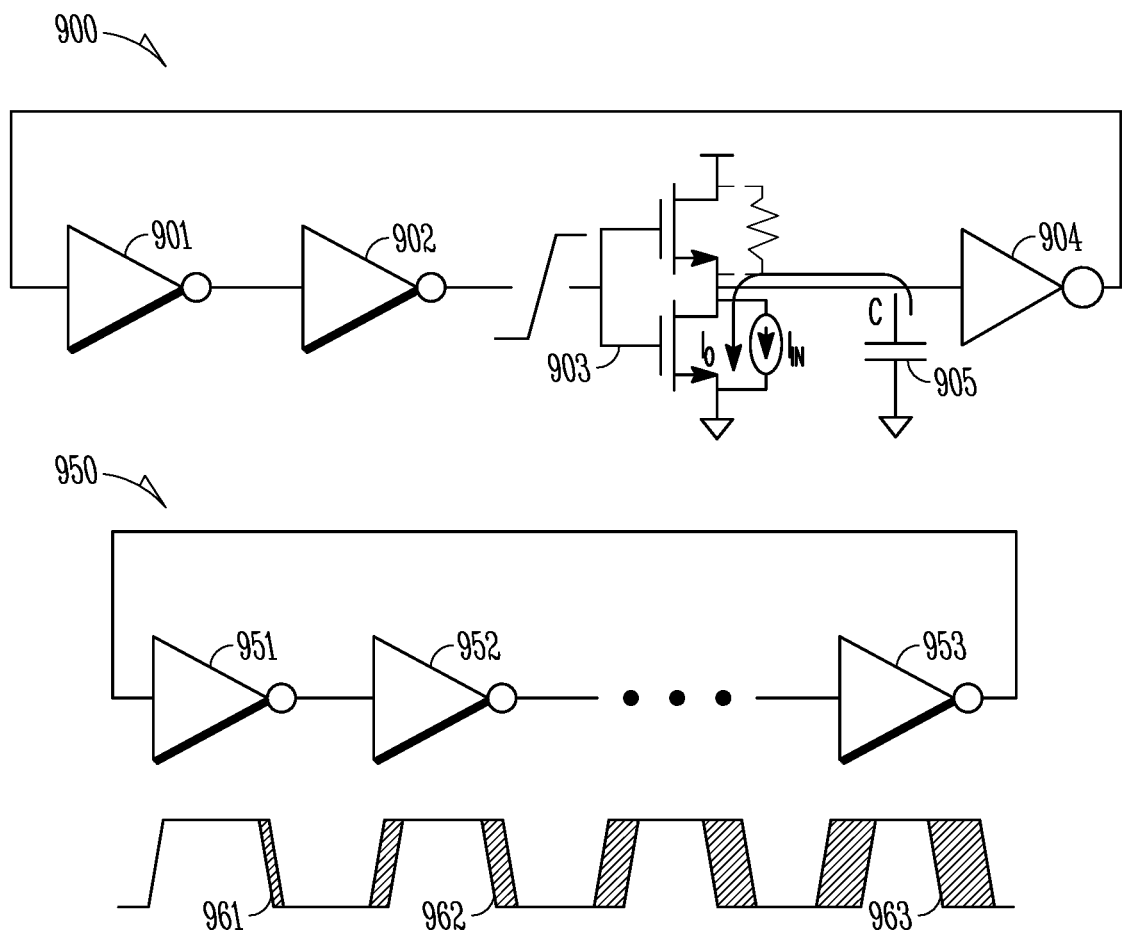
FIG. 9 illustrates an example ring oscillator in accordance with some aspects of present disclosure.
Figure 10:
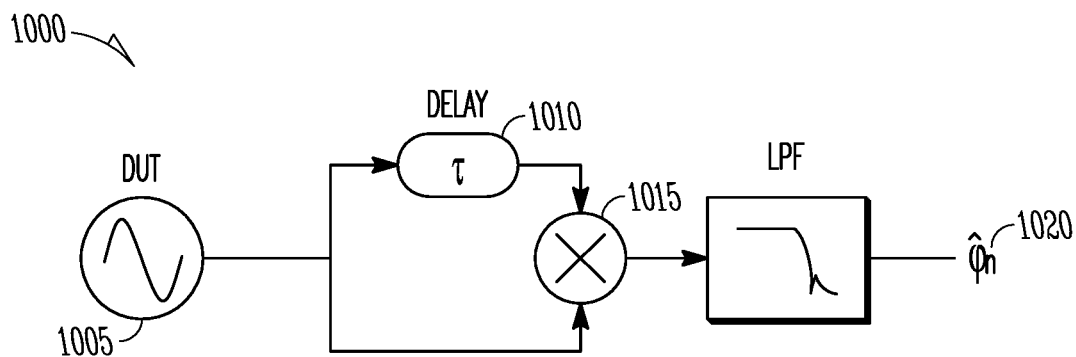
FIG. 10 illustrates example jitter estimation circuitry in accordance with some aspects of present disclosure.
Figure 11:
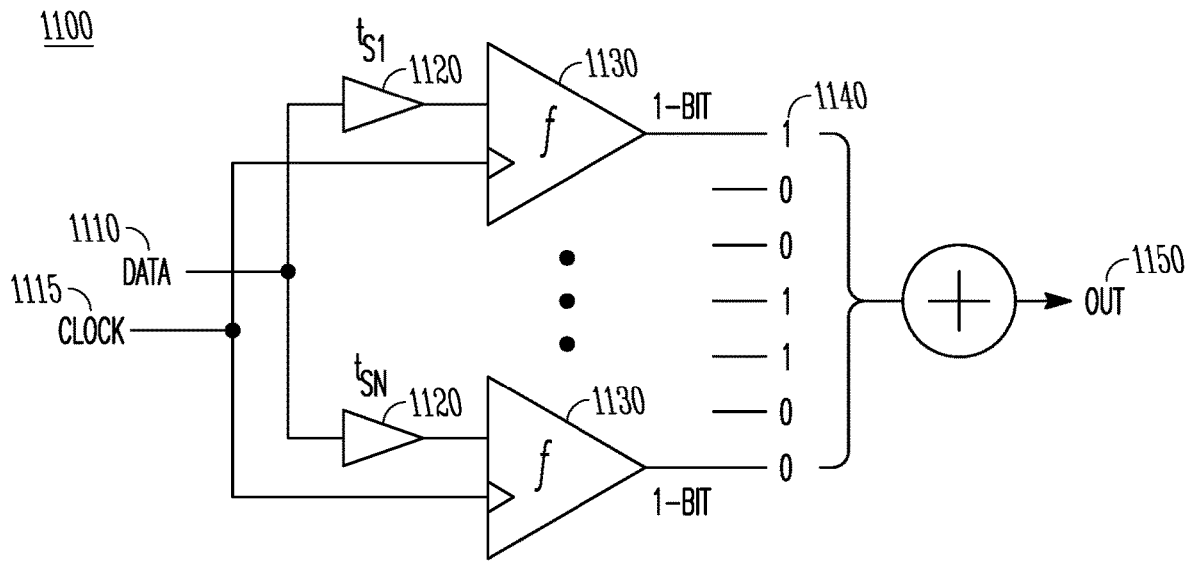
FIG. 11 illustrates an example stochastic time to digital converter (STDC) in accordance with some aspects of present disclosure.
Figure 12:
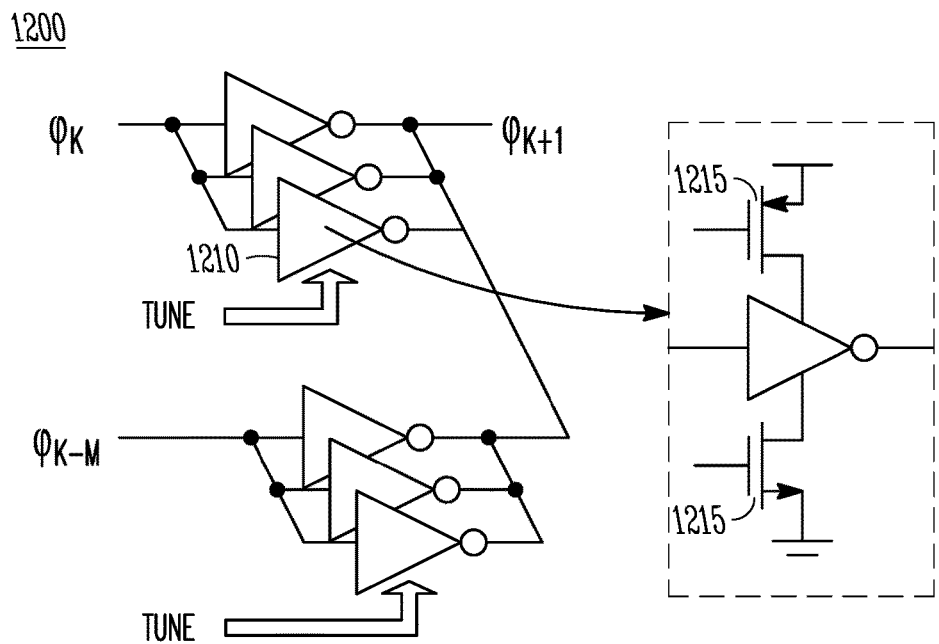
FIG. 12 illustrates example jitter compensation circuitry in accordance with some aspects of present disclosure.

FIG. 7 illustrates example multiplying delay lock loop (MDLL) circuitry in accordance with some aspects of present disclosure. FIG. 8 illustrates example MDLL circuitry in accordance with some aspects of present disclosure. FIG. 9 illustrates an example ring oscillator in accordance with some aspects of present disclosure. FIG. 10 illustrates example jitter estimation circuitry in accordance with some aspects of present disclosure. FIG. 11 illustrates an example stochastic time to digital converter (STDC) in accordance with some aspects of present disclosure. FIG. 12 illustrates example jitter compensation circuitry in accordance with some aspects of present disclosure. It should be noted that the examples shown in FIGS. 7-12 may illustrate some or all of the concepts and techniques described herein in some cases, but aspects of present disclosure are not limited by the examples. For instance, aspects of present disclosure are not limited by the name, number, type, size, ordering, arrangement and/or other aspects of the operations, components, connections, signals, input signals, output signals, reference signals and other elements as shown in FIGS. 7-12. Although some of the elements shown in the examples of FIGS. 7-12 may be included in a standard, such as 802.11, 802.11ay, WLAN, 3GPP and/or other, aspects of present disclosure are not limited to usage of such elements that are included in standards.

Referring to the example in FIG. 7, a reference signal 710 may be input as 718 to the multiplexer 720. In some aspects of present disclosure, the pulse generator 712 may receive the reference signal 710 as input and may generate the signal 718. The signal 716 may also be input to the multiplexer 720, which may select one of the two signals 716, 718 as the output signal 725 for input to the cascade of delay elements (731-734). For instance, the output signal 725 may be input to the first delay element 731 of the cascade, although the scope of aspects of present disclosure is not limited in this respect. The signal 716 may be received from the final delay element 734 of the cascade. The final delay element 734 may output the signal 760. The signal 760 may be an MDLL output signal and/or MDLL output clock signal, in some aspects of present disclosure. The servo loop 705 and the frequency divider 707 may provide synchronization operation(s) for the circuitry 700, in some aspects of present disclosure.

As a non-limiting example, the signals 740 and 741 may be compared (such as rising edges and/or falling edges) by the STDC 742, and the averaging circuitry 743 may determine the jitter estimate 744. The signals 750 and 751 may be compared (such as rising edges and/or falling edges) by the STDC 752, and the averaging circuitry 753 may determine the jitter estimate 754. Compensation for the jitter estimates 744 and 754 may be performed. In some cases, a combined jitter estimate (such as an average of 744 and 754) may be used. It should be noted that the averaging circuitry may include any suitable component(s) that may determine the average. For instance, one or more discrete component(s), processing circuitry and/or other components may be used.

In some cases, ring-based oscillators may enable compact local oscillator (LO) generation, but may have a significant noise power penalty relative to inductor based architectures. Ring-based oscillators may be embedded in feedback loops for phase/frequency stability. PLLs may compare samples of the oscillator phase against a reference and may track out variations. In some cases, due to stability constraints and/or other reason(s), PLLs may provide oscillator noise suppression within a limited bandwidth. For instance, the bandwidth may be limited to less than one-tenth of the reference frequency, in some cases.

In some aspects of present disclosure, multiplying delay-locked loops (MDLLs) and injection-locked oscillators may provide oscillator noise suppression over larger bandwidths (such as up to one fourth of the reference frequency) by periodically replacing the oscillator edge with a clean reference edge. In some cases, this may result in the removal of the accumulated phase noise per reference period, thereby providing a wider noise suppression bandwidth than a conventional PLL. The in-band noise may be limited by the incremental additive jitter of each traversal through the ring oscillator (equivalent to cycle jitter of the oscillator). In some cases, such performance (in terms of noise suppression bandwidth) may be sufficient for standards with relatively low data rates, such as Bluetooth low energy or Zigbee. However, such performance may not be sufficient for protocols with higher data rates, such as Wi-Fi, WLAN, cellular and/or other. Phase noise targets and/or requirements in these higher data-rate protocols may be related to EVM, SNR, regulatory spectral emissions standards, multi-radio co-existence and blocking profiles and/or other factor(s). In some cases, it may be beneficial and/or necessary to suppress the additive noise of the ring oscillator over a wider bandwidth than described above.

In some aspects of present disclosure, a phase noise (and/or jitter) estimation and compensation technique for MDLLs may enable extension of a bandwidth over which ring oscillator phase noise may be suppressed. Usage of such techniques in higher data-rate standards may be possible, in some cases.

In some aspects of present disclosure, a ring oscillator based fractional-N MDLL may use one or more techniques, such as: wideband estimation of the oscillator cycle jitter by comparing the different phases of the oscillator against one another; stochastic TDC (STDC) based measurement of the cycle jitter; cancellation of the phase noise by modulation of oscillator delay; and/or other technique(s).

Referring to FIG. 8, an example fractional-N multiplying delay lock loop (MDLL) 800 is shown. The core circuit includes a ring oscillator 810 which is adjusted to a target frequency. The ring oscillator may include multiple delay elements 814. It should be noted that aspects of present disclosure are not limited to usage of delay elements 814, as delay elements, inverters and/or a combination thereof may be used in some aspects of present disclosure. The ring oscillator 810 may also include a multiplexer 812. A rising (or falling) edge of the reference clock 805 generates a pulse that is injected into the delay line (delay elements) 814 of the ring oscillator 810. As this pulse traverses the ring oscillator delay stages 814, it accumulates jitter which appears on each of the output high frequency edges. After a number of cycles of the output, the previous reference edge with accumulated jitter is replaced with a new clean reference derived pulse (via the multiplexer 812) and the process repeats. Since subsequent clean edges of the reference clock 805 are used to replace the internally generated edge, the accumulated jitter is reset. An auxiliary servo/feedback loop 830 adjusts the frequency of the ring oscillator 810 to the correct multiple of the reference clock 805 by minimizing the phase error between the reference and the replaced edge. A digital-to-time converter (DTC) 807 spanning one ring oscillator period delays reference edges by different amounts to extend the multiplication to fractional-N synthesis. In some cases, a phase noise (jitter) of ring oscillators may be related to a number, sizing and/or power consumption of the delay elements 814.

Referring to FIG. 9, an example delay line 900 includes multiple delay elements 901-904. Details are shown for the delay element 903, and it is understood that other elements 901, 902, 904 and/or others may or may not be similar. As each stage in the delay line toggles, the intrinsic thermal and flicker noise in the drain currents of the pull-up/pull-down transistors may accumulate on to a load capacitor (such as capacitor 905 of delay element 903). This has the effect of modulating the time instant at which the output waveform crosses the trip point of the following stage. As the edges propagate through the ring oscillator 900, each stage successively adds its own jitter to the waveform at its output. Therefore, jitter in the instantaneous period of the ring oscillator (cycle jitter) is the sum of the uncorrelated jitter from the stages that constitute the ring oscillator. Furthermore, the edges of the ring oscillator are determined by the accumulation of the jitter from multiple traversals of the different stages of the ring as shown in 950. The jitter 961-963 may increase/accumulate for the delay elements 951-953. The accumulation may result in a phase noise profile that includes $1/(f^2)$ and/or $1/(f^3)$ regions, in some cases.

In some cases, an accumulated jitter in a ring oscillator may be reset periodically (such as every N cycles) by the lower jitter of the clean reference pulse. This may result in a lowered phase noise of an MDLL compared to a DPLL around the loop bandwidth (typically between 100 kHz and a few MHz). However, at large offset (such as >10 MHz) frequencies, the phase noise performance is still set by the ring oscillator. The high phase noise of the ring (compared against an LC-oscillator based PLL) may be challenging for spectral emissions in adjacent and alternate channels (ACLR) as well as to support duplex operation, multi-radio coexistence and regulatory specifications.

In some aspects of present disclosure, phase noise may be reduced at larger offset frequencies by measurement of the period (cycle) jitter. If the variation of each period (or at least some of the periods) is measured by comparison of each oscillator edge against the preceding edge, the cycle jitter may be extracted with very high bandwidth (limited by oscillator frequency). The error signal may be fed back into the stages of the oscillator with opposite polarity to correct the error. For this technique, the delay between consecutive edges of the oscillator may be measured with sufficient resolution. For example, with a 2.5 GHz oscillator with a period jitter in the order of 100-200 fs, the measurement circuit may have a delay range of ~400 ps and a resolution on the order of 30-100 fs. Additionally, this circuit may be restricted to not add jitter larger than ~100-200 fs.

In a non-limiting example, phase noise measurement systems in spectrum analyzers, signal source analyzers and jitter measurement instruments may use a delay line discriminator approach (an example of which is shown in FIG. 10). This approach may have one or more advantages over more direct spectrum measurements, in some cases. This approach may not necessarily need a spectrally pure reference clock source and may be able to extract the phase noise over a wide range of offset frequencies.

In some aspects of present disclosure, the approach described regarding FIG. 10 may be adapted to ring oscillators by exploiting the ring oscillator stages as the delay line. Consider comparing the outputs of different stages of the ring oscillator (that are in quadrature, for example) using a mixer. The low pass filtered output may include the incremental phase noise from traversing a quarter of the ring oscillator period. For measurement of the added cycle jitter of an MDLL, a time-digital converter (TDC) (instead of the mixer 1015 in FIG. 10) may extract the time difference between consecutive edges of the output. In order to minimize the jitter addition from the TDC, it is desirable to span a small delay in the TDC. The presence of multiple edges in the delay line can again be exploited to pick phases from the delay line that have close time spacing. Without loss of generality, consider a delay line with N stages in which alternate edges from the half the delay line are compared. In the first traversal through the delay line, the jitter at the output of stage N/2 is compared against the closest edge of the clean injected pulse. This measures the added jitter from half the delay line. Ideally, the two compared edges should occur simultaneously but with opposite polarity. In addition to added jitter, duty-cycle errors, and mismatch between the delay cells will move the two compared edges relative to each other. This is the dynamic range that the TDC may be able to handle and is expected to be of the order of ~1-2 ps. Next, the output of stage N may be compared against the nearest edge from stage N/2 to extract the added jitter from the remaining stages. This is the edge that is re-circulated into the delay line. So by successively comparing closely spaced edges from different stages of the ring, the correlated components of the cycle jitter may be tracked out.

In some aspects of present disclosure, a stochastic time to digital converter (STDC) may include an array of latches with data and clock inputs connected in parallel. A statistical distribution of setup times in the latches due to random manufacturing variations may provide spatial averaging, in some cases. Any one latch shows a Gaussian distribution of set-up times. If the outputs of the latches are summed-up then the output is a function of the input time difference as shown in FIG. 11. The resolution depends on the statistical spread of the set-up time and the number of flip-flops. In typical advanced CMOS process nodes small STDCs (for instance, with 8-16 latches) may achieve a raw resolution of 0.5 ps with a range of 5-10 ps. In order to improve the resolution of the STDC to better than 0.1 ps, time averaging of multiple measurements may be used.

In some aspects of present disclosure, jitter measurements may be performed for each of the multiple phases of a ring oscillator. Furthermore, the measurements may be averaged or filtered, in some aspects of present disclosure. For instance, the correction may be desired over a narrow band (such as at the duplex spacing), in some cases. This may limit the highest frequency components of the jitter that can be tracked out. Since the measurements are at the oscillator output frequency, and this technique may be restricted to tracking of correlated components of the jitter, a range of offsets for which the technique may be applicable may be restricted. For instance, the range may be less than 100 MHz, in some cases.

Referring to FIG. 12, an example scheme to cancel out the measured jitter by modulating a delay cell with opposite polarity is shown. For instance, signals connected to the capacitor(s) 1215 connected to delay element 1210 may be modulated. To suppress the phase noise, the correction may be applied within the ring oscillator loop. Either an explicit DTC inside the loop or the delay tuning mechanism for any of the delay cells can be re-purposed for this. In order to do so, without incurring the power and jitter penalty of additional DTCs, the correction may be applied through modulation of a capacitor. Alternately, with interpolating delay cells in the ring oscillator, interpolation weight modulation may be used.

In Example 1, multiplying delay lock loop (MDLL) circuitry may comprise a multiplexer. The MDLL circuitry may further comprise a ring oscillator. The ring oscillator may comprise a cascade of delay elements. The multiplexer may be configured to receive a reference clock signal. The multiplexer may be further configured to receive a ring oscillator output signal from a final delay element of the cascade. The multiplexer may be further configured to select, as a ring oscillator input signal, either the reference clock signal or the ring oscillator output signal. The ring oscillator may be configured to receive, at a first delay element of the cascade, the ring oscillator input signal from the multiplexer. The ring oscillator may be further configured to determine a jitter estimate based at least partly on a comparison between output signals of two of the delay elements. The ring oscillator may be further configured to compensate delay responses of the delay elements based at least partly on the jitter estimate to generate the ring oscillator output signal.

In Example 2, the subject matter of Example 1, wherein the cascade may comprise the first delay element, the final delay element, and one or more other delay elements. The final delay element may be configured to receive, as a final input signal, the output signal from the delay element of the cascade that immediately precedes the final delay element. The final delay element may be further configured to delay the final input signal to generate the ring oscillator output signal.

In Example 3, the subject matter of one or any combination of Examples 1-2, wherein the ring oscillator may be further configured to determine the jitter estimate based on a time difference between a rising edge of an output signal of a first delay element and a falling edge of an output signal of a second delay element.

In Example 4, the subject matter of one or any combination of Examples 1-3, wherein the ring oscillator may further comprise a stochastic time to digital converter (STDC) and averaging circuitry. The STDC may be configured to receive output signals of first and second delay elements. The STDC may be further configured to determine one or more time differences between a rising edge of the output signal of the first delay element and a falling edge of the output signal of the second delay element. The averaging circuitry may be configured to determine the jitter estimate based on an average of the time differences determined by the STDC.

In Example 5, the subject matter of one or any combination of Examples 1-4, wherein the ring oscillator may be further configured to determine the jitter estimate based on a time difference between: a rising edge of an output signal of a first delay element and a falling edge of an output signal of a second delay element, rising edges of output signals of two of the delay elements, or falling edges of output signals of two of the delay elements.

In Example 6, the subject matter of one or any combination of Examples 1-5, wherein the ring oscillator may be further configured to determine time differences between rising edges or falling edges of output signals of multiple pairs of the delay elements. The ring oscillator may be further configured to determine the jitter estimate based on an average of the time differences.

In Example 7, the subject matter of one or any combination of Examples 1-6, wherein the two delay elements of the comparison may be spaced apart within the cascade by half of a total number of delay elements of the cascade.

In Example 8, the subject matter of one or any combination of Examples 1-7, wherein the ring oscillator may be further configured to adjust the delay responses by modulation of input voltages of capacitors of the delay elements, the modulation based at least partly on the estimated jitter.

In Example 9, the subject matter of one or any combination of Examples 1-8, wherein the multiplexer may be further configured to detect a rising edge of the reference clock signal. The multiplexer may be further configured to select the reference clock signal for input to the ring oscillator input signal in response to the detection of the rising edge of the reference clock signal.

In Example 10, the subject matter of one or any combination of Examples 1-9, wherein a clock frequency of the MDLL output clock signal may be inversely related to a sum of delays of the delay elements of the cascade.

In Example 11, the subject matter of one or any combination of Examples 1-10, wherein the MDLL circuitry may further comprise a frequency lock loop (FLL). The FLL may be configured to output an FLL clock signal for input to the delay elements as a drive signal. A clock frequency of the FLL clock signal may be based at least partly on a frequency multiple between a target clock frequency of the MDLL output signal and a clock frequency of the reference clock signal. The MDLL circuitry may be configurable as fractional-N MDLL circuitry if the frequency multiple is configurable for fractional numbers. The MDLL circuitry may be configurable as integer-N MDLL circuitry if the frequency multiple is restricted to integer numbers.

In Example 12, the subject matter of one or any combination of Examples 1-11, wherein the MDLL circuitry may further comprise a digital-to-time converter (DTC). The DTC may be configured to receive a DTC input that includes a target time difference. The DTC may be further configured to generate the reference clock signal as a clock signal for which a time difference between successive rising edges is based on the target time difference.

In Example 13, multiplying delay lock loop (MDLL) circuitry may comprise a cascade of delay elements. An input signal for the cascade may be based at least partly on an output signal of the cascade. An MDLL output clock signal may be based at least partly on the output signal of the cascade. The MDLL circuitry may further comprise jitter compensation circuitry. The jitter compensation circuitry may be configured to determine a jitter estimate based at least partly on a comparison between the output signals of two of the delay elements of the cascade. The jitter compensation circuitry may be further configured to adjust delay responses of at least some of the delay elements to compensate for the jitter estimate.

In Example 14, the subject matter of Example 13, wherein the MDLL circuitry may further comprise a multiplexer. The multiplexer may be configured to receive a reference clock signal. The multiplexer may be further configured to receive the output signal of the cascade. The multiplexer may be further configured to select, as the input signal for the cascade, either the output signal of the cascade or the reference clock signal.

In Example 15, the subject matter of one or any combination of Examples 13-14, wherein the multiplexer may be further configured to detect a rising edge of the reference clock signal. The multiplexer may be further configured to select the reference clock signal as the input signal for the cascade in response to the detection of the rising edge of the reference clock signal.

In Example 16, the subject matter of one or any combination of Examples 13-15, wherein the comparison between the output signals of the two delay elements may include a comparison of a rising edge of one of the output signals and a falling edge of the other of the output signals.

In Example 17, the subject matter of one or any combination of Examples 13-16, wherein the jitter compensation circuitry may comprise a stochastic time to digital converter (STDC) and averaging circuitry. The two delay elements of the cascade for the comparison may be a first delay element and a second delay element. The STDC may be configured to receive the output signals of the first and second delay elements. The STDC may be further configured to determine one or more time differences between a rising edge of the output signal of the first delay element and a falling edge of the output signal of the second delay element. The averaging circuitry may be configured to determine the jitter estimate based on an average of the time differences determined by the STDC.

In Example 18, the subject matter of one or any combination of Examples 13-17, wherein the cascade of delay elements and the jitter compensation circuitry may be part of a ring based oscillator.

In Example 19, a communication device may comprise multiplying delay lock loop (MDLL) circuitry and a transceiver. The MDLL circuitry may comprise a cascade of delay elements, jitter compensation circuitry, and MDLL output circuitry. A final delay element of the cascade may be configured to delay a final input signal to generate a final output signal. The jitter compensation circuitry may be configured to compare the output signals of one or more pairs of the delay elements to determine a jitter estimate. The jitter compensation circuitry may be further configured to adjust delay responses of at least some of the delay elements to compensate for the jitter estimate. The MDLL circuitry may be configured to generate an MDLL output clock signal based on the final output signal from the final delay element. The transceiver may be configured to multiply a baseband signal by the MDLL output clock signal to up-convert the baseband signal to a radio frequency (RF) range.

In Example 20, the subject matter of Example 19, wherein the MDLL circuitry may further comprise a multiplexer. The multiplexer may be configured to receive a reference clock signal. The multiplexer may be further configured to receive the final output signal from the final delay element. The multiplexer may be further configured to select, for input to the first delay element as the first input signal, either the final output signal or the reference clock signal.

In Example 21, the subject matter of one or any combination of Examples 19-20, wherein the jitter compensation circuitry may comprise a stochastic time to digital converter (STDC) and averaging circuitry. The STDC may be configured to receive the output signals of one of the pairs of delay elements. The STDC may be further configured to determine one or more time differences between rising edges of one of the received output signals and falling edges of the other received output signal. The averaging circuitry may be configured to determine the jitter estimates based at least partly on an average of the time differences determined by the STDCs.

In Example 22, the subject matter of one or any combination of Examples 19-21, wherein the jitter compensation circuitry may be further configured to adjust the delay responses by modulation of input voltages of capacitors of the delay elements, the modulation based at least partly on the estimated jitter.

In Example 23, a method of jitter compensation may comprise receiving a reference clock signal. The method may further comprise receiving a ring oscillator output signal from a final delay element of the cascade of delay elements. The method may further comprise selecting, for input to the ring oscillator input signal, either the reference clock signal or the ring oscillator output signal. The method may further comprise determining a jitter estimate based at least partly on a comparison between output signals of two particular delay elements of the cascade. The method may further comprise compensating delay responses of the delay elements of the cascade based at least partly on the jitter estimate. The method may further comprise outputting the ring oscillator output signal as an output clock signal.

In Example 24, the subject matter of Example 23, wherein the method may further comprise determining the jitter estimate based on a time difference between a rising edge of the output signal of one of the particular delay elements and a falling edge of the output signal of the other of the particular delay elements.

In Example 25, the subject matter of one or any combination of Examples 23-24, wherein the method may further comprise adjusting the delay responses by modulation of input voltages of capacitors of the delay elements, the modulation based at least partly on the estimated jitter.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. Multiplying delay lock loop (MDLL) circuitry, comprising:
a multiplexer; and a ring oscillator, the ring oscillator comprising a cascade of delay elements including a first delay element and a final delay element,
the multiplexer configured to:
receive a reference clock signal;
receive a ring oscillator output signal from the final delay element of the cascade; and
select, as a ring oscillator input signal, either the reference clock signal or the ring oscillator output signal;
the ring oscillator configured to:
receive, at the first delay element of the cascade, the ring oscillator input signal from the multiplexer;
determine a jitter estimate based at least partly on a comparison between output signals of two of the delay elements; and
compensate delay responses of the delay elements based at least partly on the jitter estimate to generate the ring oscillator output signal.

2. The MDLL circuitry according to claim 1, wherein:
the cascade comprises the first delay element, the final delay element, and one or more other delay elements,
the final delay element is configured to:
receive, as a final input signal, the output signal from the delay element of the cascade that immediately precedes the final delay element; and
delay the final input signal to generate the ring oscillator output signal.

3. The MDLL circuitry according to claim 1, the ring oscillator further configured to:
determine the jitter estimate based on a time difference between a rising edge of an output signal of a first delay element and a falling edge of an output signal of a second delay element.

4. The MDLL circuitry according to claim 1, wherein the ring oscillator further comprises a stochastic time to digital converter (STDC) and averaging circuitry, wherein:
the STDC is configured to:
receive output signals of first and second delay elements; and
determine one or more time differences between a rising edge of the output signal of the first delay element and a falling edge of the output signal of the second delay element,
the averaging circuitry is configured to:
determine the jitter estimate based on an average of the time differences determined by the STDC.

5. The MDLL circuitry according to claim 1, the ring oscillator further configured to:
determine the jitter estimate based on a time difference between:
a rising edge of an output signal of a first delay element and a falling edge of an output signal of a second delay element,
rising edges of output signals of two of the delay elements, or
falling edges of output signals of two of the delay elements.

6. The MDLL circuitry according to claim 1, the ring oscillator further configured to:
- determine time differences between rising edges or falling edges of output signals of multiple pairs of the delay elements; and
- determine the jitter estimate based on an average of the time differences.

7. The MDLL circuitry according to claim 1, wherein the two delay elements of the comparison are spaced apart within the cascade by half of a total number of delay elements of the cascade.

8. The MDLL circuitry according to claim 1, the ring oscillator further configured to:
- adjust the delay responses by modulation of input voltages of capacitors of the delay elements, the modulation based at least partly on the estimated jitter.

9. The MDLL circuitry according to claim 1, the multiplexer further configured to:
- detect a rising edge of the reference clock signal; and
- select the reference clock signal for input to the ring oscillator input signal in response to the detection of the rising edge of the reference clock signal.

10. The MDLL circuitry according to claim 1, wherein a clock frequency of an output signal of the cascade is inversely related to a sum of delays of the delay elements of the cascade.

11. The MDLL circuitry according to claim 1, wherein:
- the MDLL circuitry further comprises a frequency lock loop (FLL),
- the FLL is configured to output an FLL clock signal for input to the delay elements as a drive signal,
- a clock frequency of the FLL clock signal is based at least partly on a frequency multiple between a target clock frequency of output signal of the cascade and a clock frequency of the reference clock signal,
- the MDLL circuitry is configurable as fractional-N MDLL circuitry if the frequency multiple is configurable for fractional numbers, and
- the MDLL circuitry is configurable as integer-N MDLL circuitry if the frequency multiple is restricted to integer numbers.

12. The MDLL circuitry according to claim 1, further comprising:
- a digital-to-time converter (DTC) configured to:
  - receive a DTC input that includes a target time difference; and
  - generate the reference clock signal as a clock signal for which a time difference between successive rising edges is based on the target time difference.

13. Multiplying delay lock loop (MDLL) circuitry, comprising:
- a cascade of delay elements, wherein:
  - an input signal for the cascade is based at least partly on an output signal of the cascade, and
  - an MDLL output clock signal is based at least partly on the output signal of the cascade;
- jitter compensation circuitry, configured to:
  - determine a jitter estimate based at least partly on a comparison between output signals of two of the delay elements of the cascade; and
  - adjust delay responses of at least some of the delay elements to compensate for the jitter estimate.

14. The MDLL circuitry according to claim 13, wherein:
- the MDLL circuitry further comprises a multiplexer, the multiplexer configured to:
  - receive a reference clock signal;
  - receive the output signal of the cascade; and
  - select, as the input signal for the cascade, either the output signal of the cascade or the reference clock signal.

15. The MDLL circuitry according to claim 14, the multiplexer further configured to:
- detect a rising edge of the reference clock signal; and
- select the reference clock signal as the input signal for the cascade in response to the detection of the rising edge of the reference clock signal.

16. The MDLL circuitry according to claim 13, wherein:
- the comparison between the output signals of the two delay elements includes a comparison of a rising edge of one of the output signals and a falling edge of the other of the output signals.

17. The MDLL circuitry according to claim 13, wherein the jitter compensation circuitry comprises a stochastic time to digital converter (STDC) and averaging circuitry, wherein:
- the two delay elements of the cascade for the comparison are a first delay element and a second delay element,
- the STDC is configured to:
  - receive the output signals of the first and second delay elements; and
  - determine one or more time differences between a rising edge of the output signal of the first delay element and a falling edge of the output signal of the second delay element,
- the averaging circuitry is configured to:
  - determine the jitter estimate based on an average of the time differences determined by the STDC.

18. The MDLL circuitry according to claim 13, wherein the cascade of delay elements and the jitter compensation circuitry are part of a ring based oscillator.

19. A communication device, comprising: multiplying delay lock loop (MDLL) circuitry and a transceiver,
- the MDLL circuitry comprising: a cascade of delay elements, jitter compensation circuitry, and MDLL output circuitry, wherein:
  - a final delay element of the cascade is configured to delay a final input signal to generate a final output signal,
  - the jitter compensation circuitry is configured to compare output signals of one or more pairs of the delay elements to determine a jitter estimate,
  - the jitter compensation circuitry is further configured to adjust delay responses of at least some of the delay elements to compensate for the jitter estimate, and
  - the MDLL circuitry is configured to generate an MDLL output clock signal based on the final output signal from the final delay element; and
- the transceiver is configured to:
  - multiply a baseband signal by the MDLL output clock signal to up-convert the baseband signal to a radio frequency (RF) range.

20. The communication device according to claim 19, wherein:
- the MDLL circuitry further comprises a multiplexer, the multiplexer configured to:
  - receive a reference clock signal;
  - receive the final output signal from the final delay element; and
  - select, for input to the first delay element as the first input signal, either the final output signal or the reference clock signal.

21. The communication device according to claim 19, wherein the jitter compensation circuitry comprises a stochastic time to digital converter (STDC) and averaging circuitry, wherein:
the STDC is configured to:
receive the output signals of one of the pairs of delay elements; and
determine one or more time differences between rising edges of one of the received output signals and falling edges of the other received output signal;
the averaging circuitry is configured to:
determine the jitter estimates based at least partly on an average of the time differences determined by the STDCs.

22. The communication device according to claim 19, the jitter compensation circuitry further configured to:
adjust the delay responses by modulation of input voltages of capacitors of the delay elements, the modulation based at least partly on the estimated jitter.

23. A method of jitter compensation, the method comprising:
receiving a reference clock signal;
receiving a ring oscillator output signal from a final delay element of a cascade of delay elements;
selecting, for input to the ring oscillator input signal, either the reference clock signal or the ring oscillator output signal;
determining a jitter estimate based at least partly on a comparison between output signals of two particular delay elements of the cascade;
compensating delay responses of the delay elements of the cascade based at least partly on the jitter estimate; and
outputting the ring oscillator output signal as an output clock signal.

24. The method according to claim 23, further comprising:
determining the jitter estimate based on a time difference between a rising edge of the output signal of one of the particular delay elements and a falling edge of the output signal of the other of the particular delay elements.

25. The method according to claim 23, further comprising:
adjusting the delay responses by modulation of input voltages of capacitors of the delay elements, the modulation based at least partly on the estimated jitter.

* * * * *

UNITED STATES PATENT AND TRADEMARK OFFICE
CERTIFICATE OF CORRECTION

PATENT NO. : 10,840,916 B2
APPLICATION NO. : 16/629170
DATED : November 17, 2020
INVENTOR(S) : Ravi et al.

Page 1 of 1

It is certified that error appears in the above-identified patent and that said Letters Patent is hereby corrected as shown below:

In the Claims

In Column 27, Line 34, in Claim 11, after "of", insert --an--

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*